(12) United States Patent
Okuma

(10) Patent No.: US 11,465,235 B2
(45) Date of Patent: Oct. 11, 2022

(54) LASER LIGHT IRRADIATING DEVICE

(71) Applicant: HAMAMATSU PHOTONICS K.K., Hamamatsu (JP)

(72) Inventor: Junji Okuma, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/343,034

(22) PCT Filed: Oct. 5, 2017

(86) PCT No.: PCT/JP2017/036362
§ 371 (c)(1),
(2) Date: Apr. 18, 2019

(87) PCT Pub. No.: WO2018/074253
PCT Pub. Date: Apr. 26, 2018

(65) Prior Publication Data
US 2020/0061740 A1 Feb. 27, 2020

(30) Foreign Application Priority Data

Oct. 19, 2016 (JP) .............................. JP2016-205294

(51) Int. Cl.
*B23K 26/064* (2014.01)
*H01L 21/67* (2006.01)
(Continued)

(52) U.S. Cl.
CPC .......... *B23K 26/064* (2015.10); *B23K 26/067* (2013.01); *B23K 26/352* (2015.10);
(Continued)

(58) Field of Classification Search
CPC ................ B23K 26/0853; B23K 26/35; B23K 26/0622; B23K 26/38; B23K 2103/50;
(Continued)

(56) References Cited

U.S. PATENT DOCUMENTS 8,743,165 B2 * 6/2014 Sandstrom ........... B23K 26/032
347/225
2011/0240611 A1 * 10/2011 Sandstrom ........... B23K 26/082
219/121.61
(Continued)

FOREIGN PATENT DOCUMENTS

CN 102792193 A 11/2012
CN 104118220 A 10/2014
(Continued)

OTHER PUBLICATIONS

International Preliminary Report on Patentability dated May 2, 2019 for PCT/JP2017/036362.

*Primary Examiner* — Dana Ross
*Assistant Examiner* — Kuangyue Chen
(74) *Attorney, Agent, or Firm* — Faegre Drinker Biddle & Reath LLP

(57) ABSTRACT

There is provided a laser light irradiating device that includes a spatial light modulator configured to modulate laser light output from a laser light source according to a phase pattern and emit the modulated laser light, an objective lens configured to converge the laser light emitted from the spatial light modulator onto the object, a focusing lens arranged between the spatial light modulator and the objective lens in an optical path of the laser light and configured to focus the laser light, and a slit member arranged at a focal position on a rear side of the focusing lens in the optical path of the laser light and configured to block a part of the laser light.

10 Claims, 21 Drawing Sheets

(51) Int. Cl.
*B23K 26/067* (2006.01)
*B23K 26/352* (2014.01)
*G02B 1/00* (2006.01)
*G02B 1/04* (2006.01)
*G02B 27/14* (2006.01)
*G02F 1/1335* (2006.01)
*G02F 1/1337* (2006.01)
*G02F 1/1343* (2006.01)

(52) U.S. Cl.
CPC ............... *G02B 1/00* (2013.01); *G02B 1/041* (2013.01); *G02B 27/147* (2013.01); *H01L 21/67115* (2013.01); *G02F 1/13439* (2013.01); *G02F 1/133553* (2013.01); *G02F 1/133723* (2013.01)

(58) Field of Classification Search
CPC .. B23K 26/066; B23K 26/067; B23K 26/032; B23K 26/06; B23K 26/0641; B23K 2101/36; G02F 1/13439; G02F 1/133723; G02F 1/133553; G02F 1/136277; G02B 5/18; G02B 1/00; G02B 27/147; G02B 1/041; H01L 21/67115; C03B 33/09
See application file for complete search history.

(56) References Cited

U.S. PATENT DOCUMENTS

| | | | |
|---|---|---|---|
| 2013/0215406 A1* | 8/2013 | Heussler | G01J 3/4531 355/67 |
| 2013/0242247 A1* | 9/2013 | Lee | H01L 33/42 349/138 |
| 2016/0147075 A1 | 5/2016 | Michalowski et al. | |

FOREIGN PATENT DOCUMENTS

| | | |
|---|---|---|
| CN | 105583526 A | 5/2016 |
| CN | 108602156 A | 9/2018 |
| JP | 3878758 B2 | 2/2007 |
| JP | 2011-31284 A | 2/2011 |
| JP | 2011-51011 A | 3/2011 |
| JP | 2012-501853 A | 1/2012 |
| JP | 2013-521131 A | 6/2013 |
| JP | 2014-501937 | 1/2014 |
| JP | 2014-59511 A | 4/2014 |
| JP | 2017-131945 A | 8/2017 |
| KR | 1020030030908 A | 4/2003 |
| TW | 200930490 | 7/2009 |
| WO | WO-2009/142103 A1 | 11/2009 |
| WO | WO-2010/030575 A2 | 3/2010 |
| WO | WO-2011/107602 A2 | 9/2011 |
| WO | WO 2012/057707 A1 | 5/2012 |

* cited by examiner

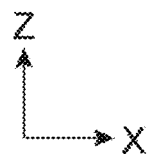
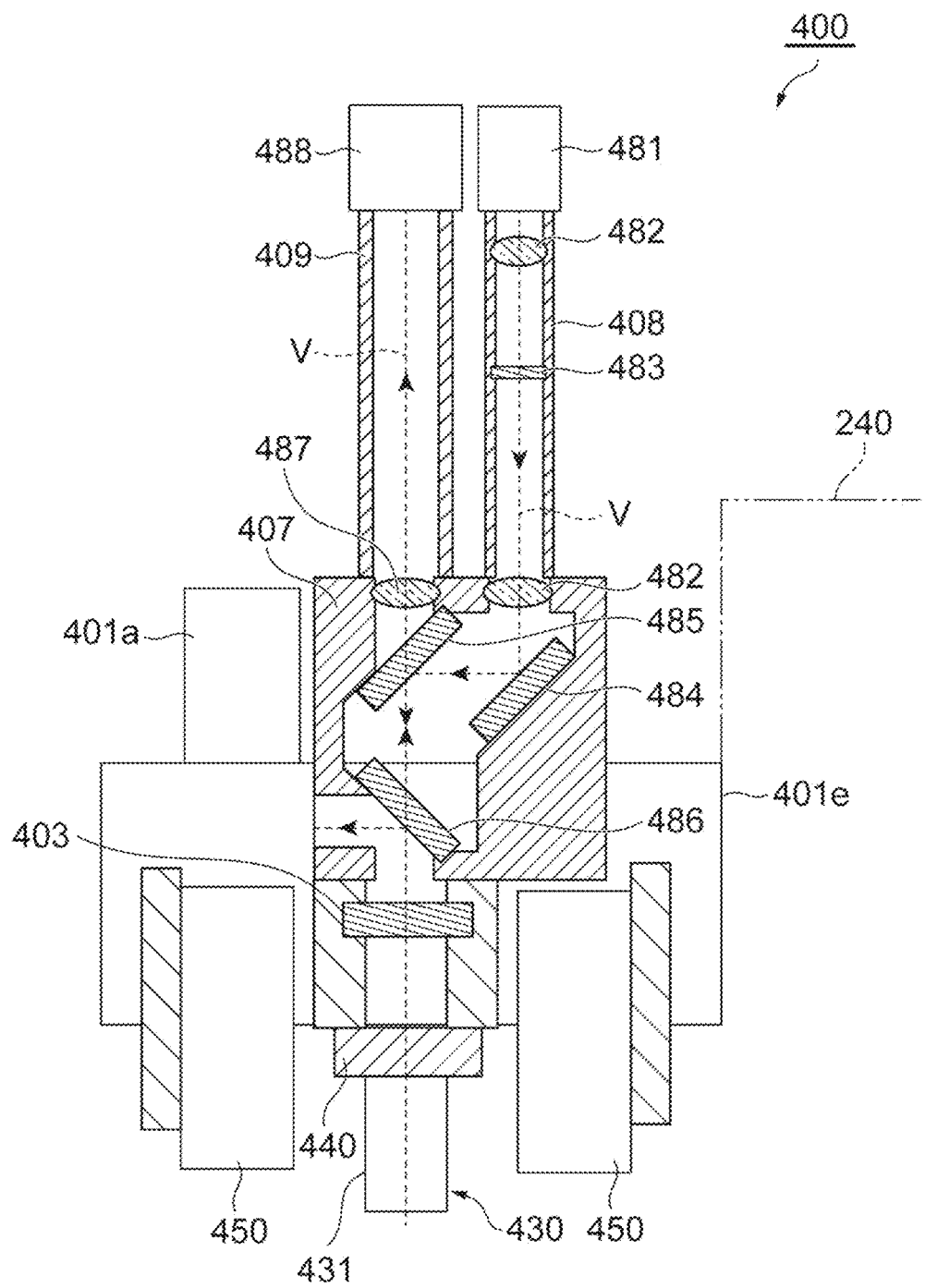

Fig.18
(a)
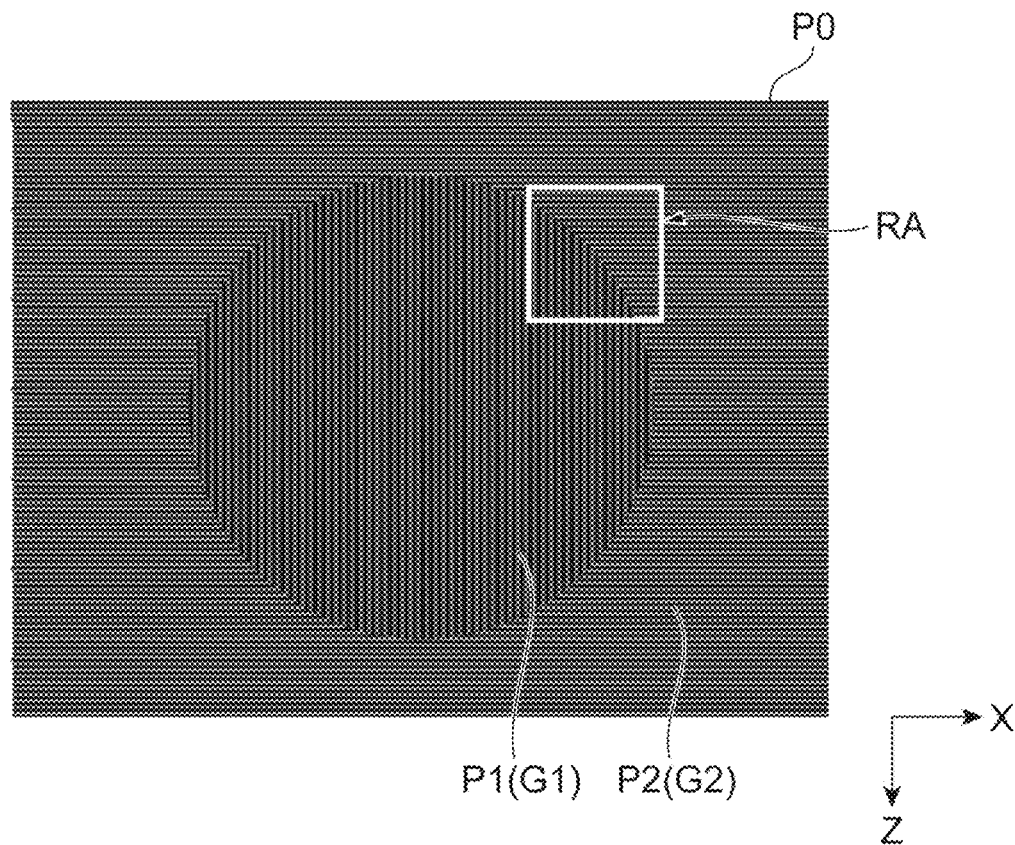
(b)
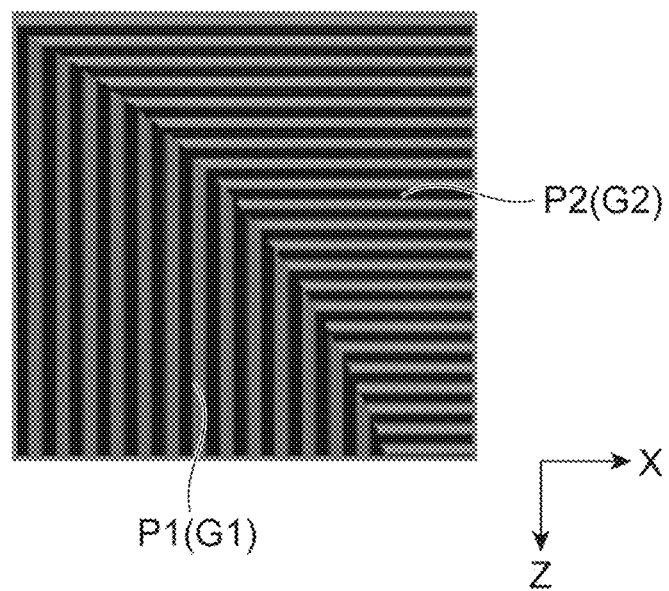

LASER LIGHT IRRADIATING DEVICE

TECHNICAL FIELD

One aspect of the present invention relates to a laser light irradiating device.

BACKGROUND ART

Patent Literature 1 discloses a laser light irradiating device that irradiates an object with laser light. In such a laser light irradiating device, laser light generated in a laser light source is modulated by a spatial light modulator, and then converged on the object by an objective lens.

CITATION LIST

Patent Literature

Patent Literature 1: Japanese Unexamined Patent Publication No. 2011-51011

SUMMARY OF INVENTION

Technical Problem

Meanwhile, when the laser light enters the objective lens via the spatial light modulator, a beam size of the laser light may be larger than a pupil plane size (pupil diameter) of the objective lens at times. In such a case, while a part of the laser light enters the pupil plane of the objective lens, the remainder of the laser light enters another member such as a holder of the objective lens. A part of the laser light entering the pupil plane of the objective lens is effective light emitted to the object, and the remainder of the laser light entering the other member is non-effective light not emitted to the object. When the non-effective light enters the other member, heat is generated in the other member. Thus, there is a possibility that the irradiation state of the laser light onto the object changes, such as the position of the converging point of the laser light changes.

An aspect of the present invention has been conceived in view of such circumstances, and an object thereof is to provide a laser light irradiating device capable of suppressing a change in irradiation state of laser light with respect to an object.

Solution to Problem

The present inventors have studied to solve the above problems, and have obtained the following findings. That is, in order to solve the above problems, it is sufficient to block non-effective light at a front stage of an objective lens. For that purpose, for example, it is sufficient to display a phase pattern including a diffraction lattice pattern on a spatial light modulator, branch the non-effective light by diffraction, and block the branched diffracted light with a slit. One aspect of the present invention has been made as a result of further research based on such knowledge.

That is, a laser light irradiating device according to one aspect of the present invention configured to irradiate an object with laser light along a first direction, the laser light irradiating device including: a laser light source configured to output the laser light; a spatial light modulator configured to modulate the laser light output from the laser light source according to a phase pattern and emit the laser light; an objective lens configured to converge the laser light emitted from the spatial light modulator onto the object; a focusing lens arranged between the spatial light modulator and the objective lens in an optical path of the laser light and configured to focus the laser light; and a slit member arranged at a focal position on a rear side of the focusing lens in the optical path of the laser light and configured to block a part of the laser light, in which the phase pattern includes a first pattern in which a part of the laser light entering a pupil plane of the objective lens is modulated and a second pattern in which remainder of the laser light is modulated, the second pattern includes a diffraction lattice pattern for branching the remainder of the laser light into a plurality of diffracted light along a second direction crossing the first direction, and the slit member blocks the diffracted light with a slit.

In the laser light irradiating device, the laser light output from the laser light source is modulated by the phase pattern of the spatial light modulator, and then is converged toward the object by the objective lens. The phase pattern of the spatial light modulator has the first pattern that modulates a part of the laser light (effective light) entering the pupil plane of the objective lens, and the second pattern that modulates the remainder of the laser light (non-effective light). The second pattern includes a diffraction lattice pattern for diffracting light along the second direction intersecting the first direction. Therefore, the non-effective light in the laser light is branched into a plurality of diffracted light in the second direction intersecting the scanning direction of the laser light. Then, the diffracted light is blocked by the slit of the slit member at the focal position on the rear side of the focusing lens. As a result, while the effective light is emitted onto the object through the slit, the diffracted light of the non-effective light is blocked by the slit and does not reach the objective lens. Therefore, according to this laser light irradiating device, it is possible to suppress a change in irradiation state of the laser light with respect to the object.

In the laser light irradiating device according to one aspect of the present invention, the slit member may block the diffracted light with the slit formed so as to be relatively longer in the first direction than in the second direction.

Here, in the laser light irradiating device, there is a demand to irradiate the object by branching the laser light into a plurality of beams. In view of the above, in the laser light irradiating device according to one aspect of the present invention, the first pattern may include another diffraction lattice pattern for branching a part of the laser light into a plurality of other diffracted light along the first direction. In this case, the effective light of the laser light can be branched into a plurality of other diffracted light in the first direction that is the irradiation direction (scanning direction) of the laser light with respect to the object, and can be emitted onto the object.

Note that, in the following descriptions, "another diffraction lattice pattern" included in the first pattern may be referred to as (or written together with) a "first diffraction lattice pattern", and "another diffracted light" branched by the first diffraction lattice pattern may be referred to as (or written together with) a "first diffracted light". In addition, the "diffraction lattice pattern" included in the second pattern may be referred to as (or written together with) a "second diffraction lattice pattern", and the "diffracted light" branched by the second diffraction lattice pattern may be referred to as (or written together with) a "second diffracted light".

In the laser light irradiating device according to one aspect of the present invention, the size of the slit in the first direction may be larger than the sum of the beam size of the first diffracted light at the focal position and the branching interval of the first diffracted light (another diffracted light) at the focal position, and the size of the slit in the second direction is larger than the beam size of the second diffracted light (diffracted light) at the focal position. In this case, a plurality of first diffracted light can be reliably emitted onto the object without being blocked by the slit.

In the laser light irradiating device according to one aspect of the present invention, the branching interval may be an interval of the ±one-order first diffracted light (another diffracted light) in the first direction. In this case, at least the zero-order light and the ±one-order light of the first diffracted light can be emitted onto the object.

In the laser light irradiating device according one aspect of the present invention, the size of the slit in the second direction may be smaller than a maximum diffraction distance F expressed by the following formula (1) in which a focal length of the focusing lens is represented by f, a wavelength of the laser light is represented by $\lambda$, and a pixel size of the spatial light modulator is represented by $x_{SLM}$. In this case, the second diffracted light can be reliably blocked by the slit.

[Formula 1]

$$F = 2f \times \tan\left(\sin^{-1}\left(\frac{\lambda}{2x_{SLM}}\right)\right) \quad (1)$$

In the laser light irradiating device according to one aspect of the present invention, the size of the slit in the first direction may be smaller than the interval of the ±three-order first diffracted light (another diffracted light) at the focal position. In this case, the high-order light of the first diffracted light equal to or higher than ±three-order can be blocked by the slit.

In the laser light irradiating device according to one aspect of the present invention, the first diffraction lattice pattern (another diffraction lattice pattern) may include a plurality of groove patterns along the second direction, and the second diffraction lattice pattern (diffraction lattice pattern) may include a plurality of groove patterns along the first direction. In this manner, the directions of the groove patterns of the first diffraction lattice pattern and the second diffraction lattice pattern are set to be crossed, whereby the branching direction of the first diffracted light and the branching direction of the second diffracted light can be set different from each other.

In the laser light irradiating device according to one aspect of the present invention, the spatial light modulator may include a liquid crystal layer for displaying the phase pattern, the liquid crystal layer may include a circular effective region in the region where the laser light is incident and an annular non-effective region outside the effective region, the first pattern may be displayed in the effective region to modulate a part of the laser light, and the second pattern may be displayed in the non-effective region to modulate the remainder of the laser light. In this case, it is possible to set a shape of the beam emitted onto the object as desired according to the beam profile entering the objective lens, whereby fine processing control (irradiation control) can be performed.

Here, the laser light irradiating device according to one aspect of the present invention configured to irradiate an object with laser light along a first direction, the laser light irradiating device including: a laser light source configured to output the laser light; a spatial light modulator configured to modulate the laser light output from the laser light source according to a phase pattern and emit the modulated laser light; an objective lens configured to converge the laser light emitted from the spatial light modulator onto the object; a focusing lens arranged between the spatial light modulator and the objective lens in an optical path of the laser light and configured to focus the laser light; and a slit member arranged at a focal position on a rear side of the focusing lens in the optical path of the laser light and configured to block a part of the laser light, in which the spatial light modulator includes a liquid crystal layer configured to display the phase pattern, the liquid crystal layer includes an effective region in which a part of the laser light entering a pupil plane of the objective lens is incident and a non-effective region in which remainder of the laser light is incident, and the slit member blocks light modulated in the non-effective region with a slit.

In the laser light irradiating device, the laser light output from the laser light source is modulated by the phase pattern of the spatial light modulator, and then is converged toward the object by the objective lens. the liquid crystal layer of the spatial light modulator includes the effective region in which a part of the laser light (effective light) entering the pupil plane of the objective lens is incident, and the non-effective region in which the remainder of the laser light (non-effective light) is incident. Then, the light modulated in the non-effective region is blocked by the slit of the slit member at the focal position on the rear side of the focusing lens. As a result, while the effective light is emitted onto the object through the slit, the non-effective light is blocked by the slit and does not reach the objective lens (another member). Therefore, according to this laser light irradiating device, it is possible to suppress a change in irradiation state of the laser light with respect to the object.

Advantageous Effects of Invention

According to one aspect of the present invention, it is possible to provide a laser light irradiating device capable of suppressing a change in irradiation state of laser light with respect to an object.

BRIEF DESCRIPTION OF DRAWINGS

FIG. 13 is a sectional view of the laser converging unit taken along the line XIII-XIII of FIG. 12.

FIG. 18 is a view illustrating an exemplary phase pattern displayed on the reflective spatial light modulator.

DESCRIPTION OF EMBODIMENTS

Figure 1:
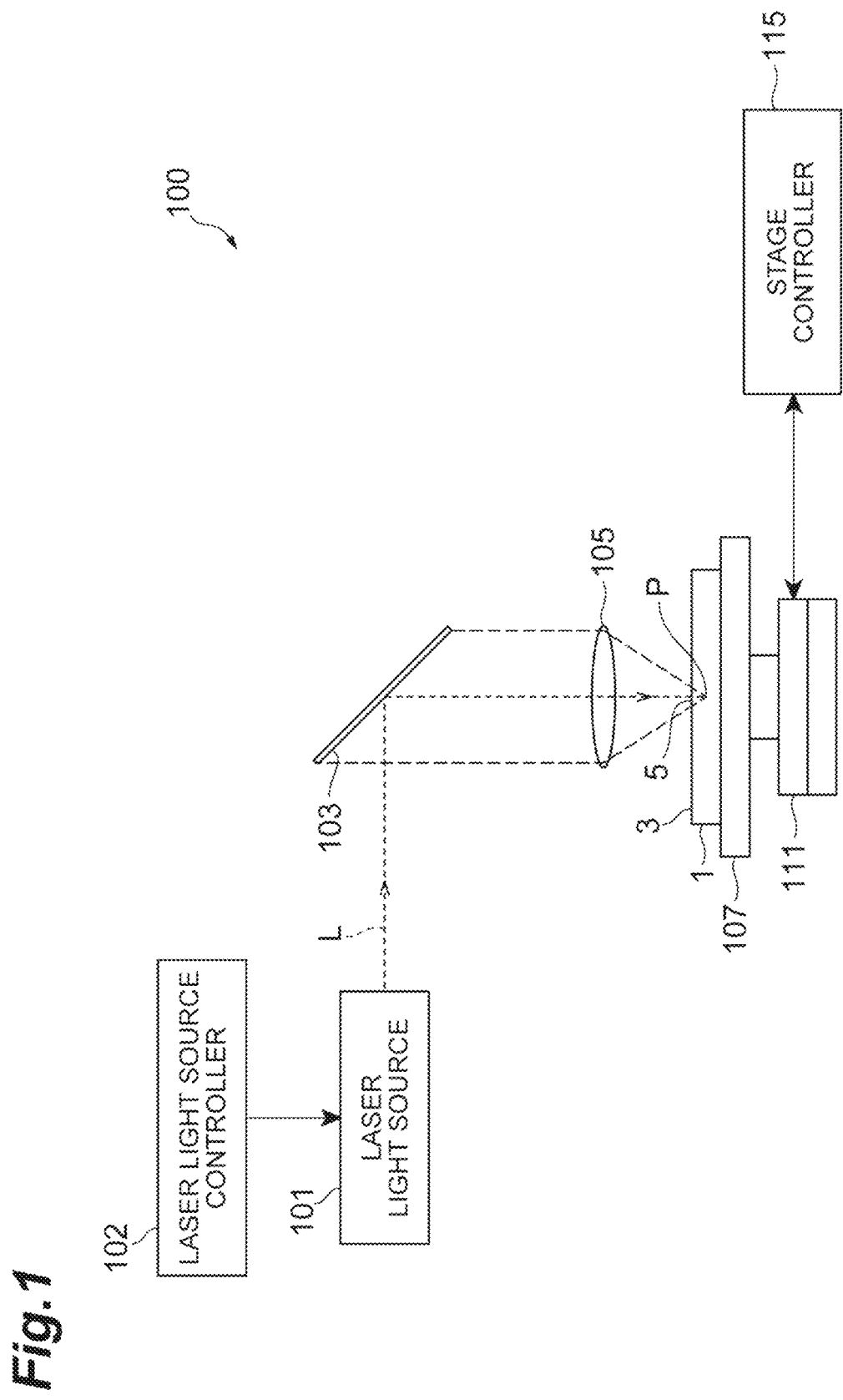
FIG. 1 is a schematic configuration diagram of a laser processing device used for forming a modified region.

Hereinafter, one embodiment of one aspect of the present invention will be described in detail with reference to the drawings. In the drawings, the same elements or corresponding elements are denoted by the same reference numerals, and overlapping explanations may be omitted.

In a laser processing device according to the embodiment, laser light is converged at an object to be processed to form a modified region within the object to be processed along a line to cut. First, formation of the modified region will be described with reference to FIGS. 1 to 6.

As illustrated in FIG. 1, a laser processing device 100 includes a laser light source 101 configured to cause laser light L to oscillate in a pulsating manner, a dichroic mirror 103 arranged so as to change a direction of the optical axis (optical path) of the laser light L by 90°, and a converging lens 105 configured to converge the laser light L. The laser processing device 100 further includes a support table 107 configured to support an object to be processed 1 that is an object to which the laser light L converged by the converging lens 105 is emitted, a stage 111 that is a moving mechanism configured to move the support table 107, a laser light source controller 102 configured to control the laser light source 101 in order to adjust the output, pulse width, pulse waveform, and the like of the laser light L, and a stage controller 115 configured to control the movement of the stage 111.

In the laser processing device 100, the laser light L emitted from the laser light source 101 changes the direction of its optical axis by 90° with the dichroic mirror 103 and then is converged by the converging lens 105 within the object to be processed 1 placed on the support table 107. At the same time, the stage 111 is moved, so that the object to be processed 1 relatively moves with respect to the laser light L along a line to cut 5. Thus, a modified region along the line to cut 5 is formed in the object to be processed 1.

While the stage 111 is moved here for relatively moving the laser light L, the converging lens 105 may be moved instead or together therewith.

Figure 2:
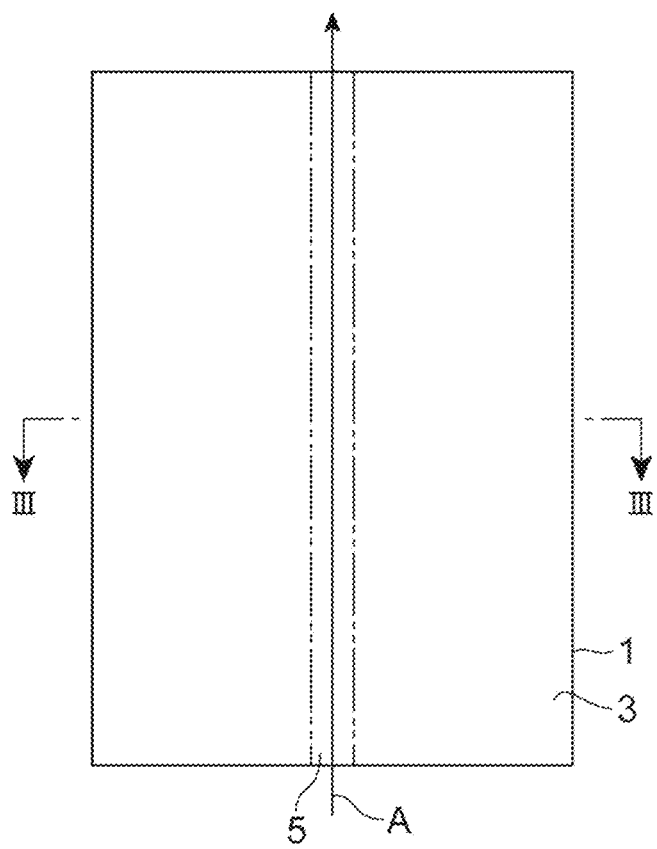
FIG. 2 is a plan view of an object to be processed for which the modified region is formed.
Figure 3:
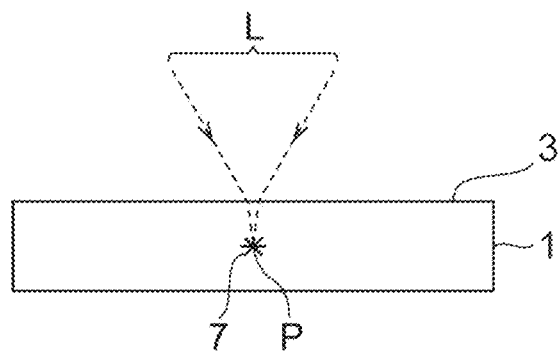
FIG. 3 is a sectional view of the object to be processed taken along the line III-III of FIG. 2.
Figure 4:
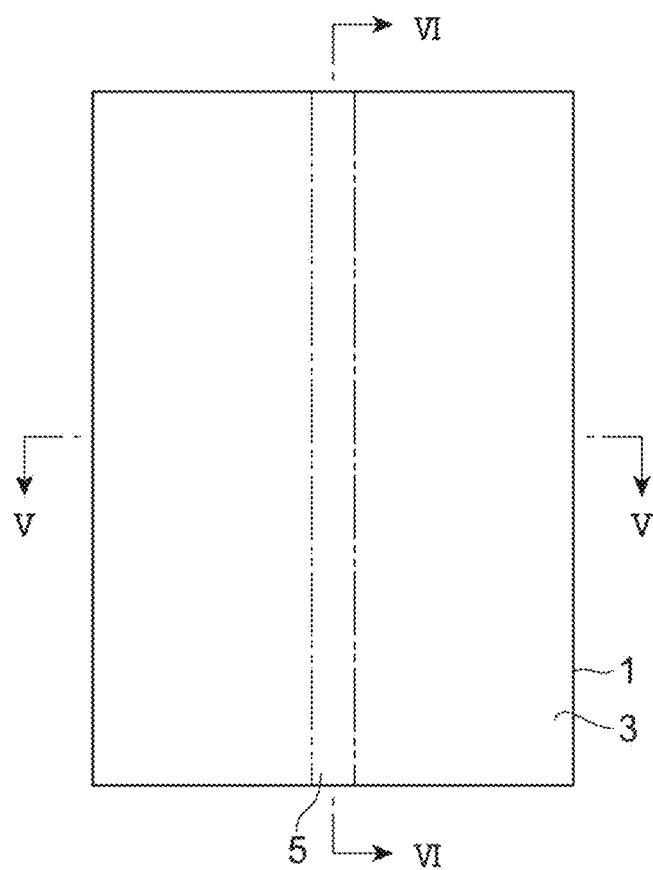
FIG. 4 is a plan view of the object to be processed after laser processing.
Figure 5:
FIG. 5 is a sectional view of the object to be processed taken along the line V-V of FIG. 4.
Figure 6:
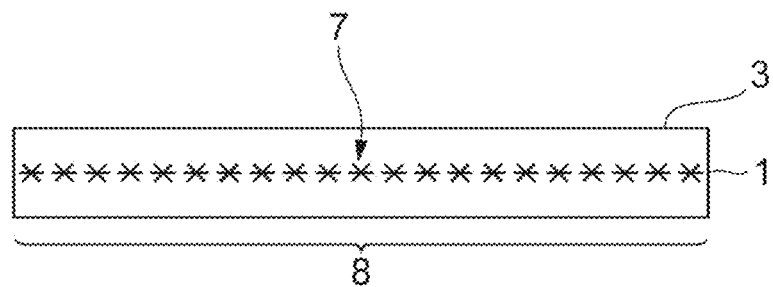
FIG. 6 is a sectional view of the object to be processed taken along the line VI-VI of FIG. 4.

Employed as the object to be processed 1 is a planar member (for example, a substrate or a wafer), examples of which include semiconductor substrates formed of semiconductor materials and piezoelectric substrates formed of piezoelectric materials. As illustrated in FIG. 2, in the object to be processed 1, the line to cut 5 is set for cutting the object to be processed 1. The line to cut 5 is a virtual line extending straight. In a case where a modified region is formed within the object to be processed 1, the laser light L is relatively moved along the line to cut 5 (that is, in the direction of arrow A in FIG. 2) while a converging point (converging position) P is set within the object to be processed 1 as illustrated in FIG. 3. Thus, a modified region 7 is formed within the object to be processed 1 along the line to cut 5 as illustrated in FIGS. 4, 5, and 6, and the modified region 7 formed along the line to cut 5 becomes a cutting start region 8. The line to cut 5 corresponds to an irradiation schedule line.

The converging point P is a position at which the laser light L is converged. The line to cut 5 may be curved instead of being straight, a three-dimensional one combining them, or one specified by coordinates. The line to cut 5 may be one actually drawn on a front surface 3 of the object to be processed 1 without being restricted to the virtual line. The modified region 7 may be formed either continuously or intermittently. The modified region 7 may be formed in either rows or dots, and only needs to be formed at least within the object to be processed 1, on the front surface 3, or on a back surface. A crack may be formed from the modified region 7 as a start point, and the crack and the modified region 7 may be exposed at an outer surface (the front surface 3, the back surface, or an outer peripheral surface) of the object to be processed 1. A laser light entrance surface in forming the modified region 7 is not limited to the front surface 3 of the object to be processed 1 but may be the back surface of the object to be processed 1.

Incidentally, in a case where the modified region 7 is formed within the object to be processed 1, the laser light L is transmitted through the object to be processed 1 and is particularly absorbed near the converging point P located within the object to be processed 1. Thus, the modified region 7 is formed in the object to be processed 1 (that is, internal absorption type laser processing). In this case, the front surface 3 of the object to be processed 1 hardly absorbs the laser light L and thus does not melt. On the other hand, in a case where the modified region 7 is formed on the front surface 3 or the back surface of the object to be processed 1, the laser light L is particularly absorbed near the converging point P located on the front surface 3 or the back surface, and removal portions such as holes and grooves are formed (surface absorption type laser processing) by being melted from the front surface 3 or the back surface and removed.

The modified region 7 is a region in which density, refractive index, mechanical strength, and other physical characteristics are different from the surroundings. Examples of the modified region 7 include a molten processed region (meaning at least one of a region resolidified after having been once molten, a region in the molten state, and a region in the process of resolidifying from the molten state), a crack region, a dielectric breakdown region, a refractive index changed region, and a mixed region thereof. Other examples of the modified region 7 include a region where the density of the modified region 7 has changed compared to the density of an unmodified region in a material of the object to be processed 1, and a region formed with a lattice defect. In a case where the material of the object to be processed 1 is single crystal silicon, the modified region 7 can also be said to be a high dislocation density region.

The molten processed region, refractive index changed region, region where the density of the modified region 7 has changed compared to the density of the unmodified region, and region formed with the lattice defect may further incorporate the crack (cracking or microcrack) therewithin or at an interface between the modified region 7 and the unmodified region. The incorporated crack may be formed over the whole surface of the modified region 7 or in only a portion or a plurality of portions thereof. The object to be processed 1 includes a substrate made of a crystalline material having a crystal structure. For example, the object to be processed 1 includes a substrate formed of at least one of gallium nitride (GaN), silicon (Si), silicon carbide (SiC), LiTaO$_3$, and sapphire (Al$_2$O$_3$). In other words, the object to be processed 1 includes, for example, a gallium nitride substrate, a silicon substrate, a SiC substrate, a LiTaO$_3$ substrate, or a sapphire substrate. The crystalline material may be either an anisotropic crystal or an isotropic crystal. In addition, the object to be processed 1 may include a substrate made of a non-crystalline material having a non-crystalline structure (amorphous structure), and may include a glass substrate, for example.

In the embodiment, the modified region 7 can be formed by forming a plurality of modified spots (processing marks) along the line to cut 5. In this case, the plurality of modified spots gathers to be the modified region 7. Each of the modified spots is a modified portion formed by a shot of one pulse of pulsed laser light (that is, laser irradiation of one pulse: laser shot). Examples of the modified spots include crack spots, molten processed spots, refractive index changed spots, and those in which at least one of them is mixed. As for the modified spots, their sizes and lengths of the crack occurring therefrom can be controlled as necessary in view of the required cutting accuracy, the required flatness of cut surfaces, the thickness, kind, and crystal orientation of the object to be processed 1, and the like. In addition, in the embodiments, the modified spots can be formed as the modified region 7, along the line to cut 5.

[Laser Processing Device According to Embodiments]

Next, the laser processing device according to the embodiments will be described. In the following descriptions, the directions orthogonal to each other in the horizontal plane are defined as the X-axis direction and the Y-axis direction, and the vertical direction is defined as the Z-axis direction.

[Overall Configuration of Laser Processing Device]

Figure 7:
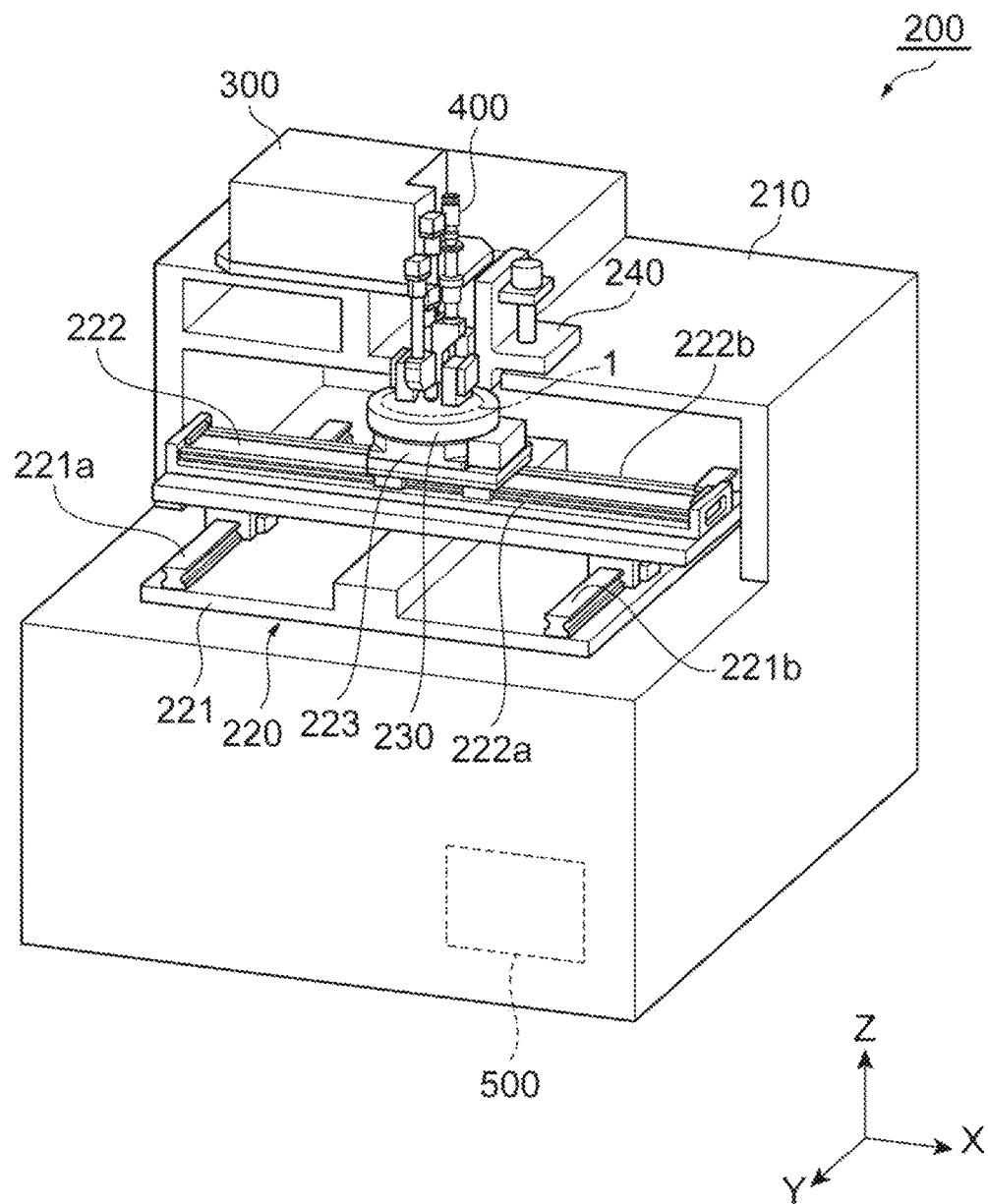
FIG. 7 is a perspective view of a laser processing device according to an embodiment.

As illustrated in FIG. 7, a laser processing device 200 includes a device frame 210, a first moving mechanism (moving mechanism) 220, a support table 230, and a second moving mechanism 240. Further, the laser processing device 200 includes a laser output unit 300, a laser converging unit 400, and a controller 500.

The first moving mechanism 220 is attached to the device frame 210. The first moving mechanism 220 includes a first rail unit 221, a second rail unit 222, and a movable base 223. The first rail unit 221 is attached to the device frame 210. The first rail unit 221 is provided with a pair of rails 221a and 221b extending along the Y-axis direction. The second rail unit 222 is attached to the pair of rails 221a and 221b of the first rail unit 221 so as to be movable along the Y-axis direction. The second rail unit 222 is provided with a pair of rails 222a and 222b extending along the X-axis direction. The movable base 223 is attached to the pair of rails 222a and 222b of the second rail unit 222 so as to be movable along the X-axis direction. The movable base 223 is rotatable about an axis parallel to the Z-axis direction as the center.

Figure 8:
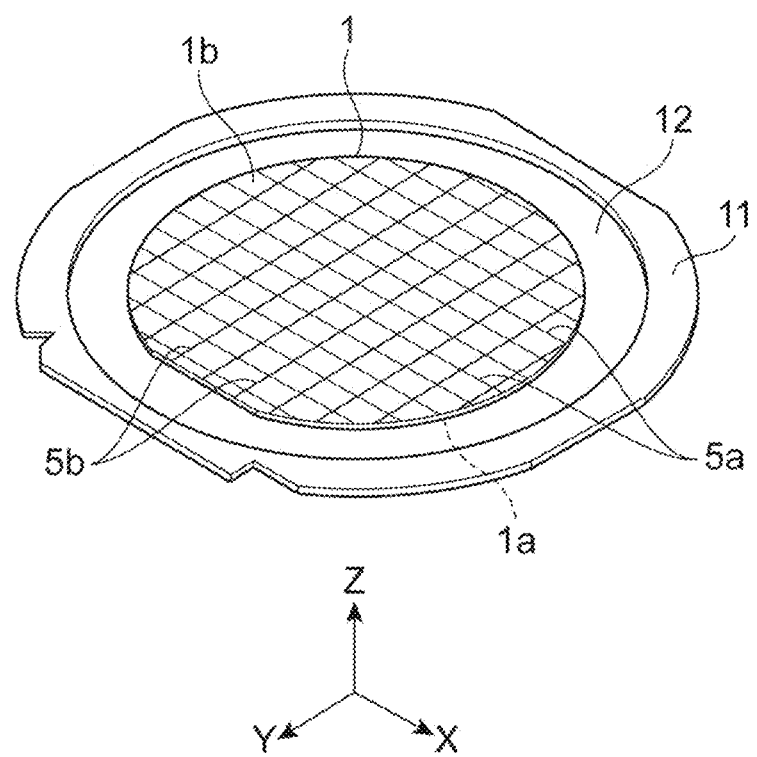
FIG. 8 is a perspective view of an object to be processed attached to a support table of the laser processing device of FIG. 7.

The support table 230 is attached to the movable base 223. The support table 230 supports the object to be processed 1. The object to be processed 1 includes a plurality of functional devices (a light receiving device such as a photodiode, a light emitting device such as a laser diode, a circuit device formed as a circuit, or the like) formed in a matrix shape on the front surface side of a substrate made of a semiconductor material such as silicon. When the object to be processed 1 is supported on the support table 230, as illustrated in FIG. 8, on a film 12 stretched over an annular frame 11, for example, a front surface 1a of the object to be processed 1 (a surface of the plurality of functional devices side) is pasted. The support table 230 holds the frame 11 with a clamp and suctions the film 12 with a vacuum chuck table, to support the object to be processed 1. On the support table 230, a plurality of lines to cut 5a parallel to each other and a plurality of lines to cut 5b parallel to each other are set in a grid pattern so as to pass between adjacent functional devices on the object to be processed 1.

As illustrated in FIG. 7, the support table 230 is moved along the Y-axis direction by operation of the second rail unit 222 in the first moving mechanism 220. In addition, the support table 230 is moved along the X-axis direction by operation of the movable base 223 in the first moving mechanism 220. Further, the support table 230 is rotated about the axis parallel to the Z-axis direction as the center by operation of the movable base 223 in the first moving mechanism 220. As described above, the support table 230 is attached to the device frame 210 to be movable along the X-axis direction and the Y-axis direction, and to be rotatable about the axis parallel to the Z-axis direction as the center.

The laser output unit 300 is attached to the device frame 210. The laser converging unit 400 is attached to the device frame 210 via the second moving mechanism 240. The laser converging unit 400 is moved along the Z-axis direction by operation of the second moving mechanism 240. As described above, the laser converging unit 400 is attached to the device frame 210 so as to be movable along the Z-axis direction with respect to the laser output unit 300.

The controller 500 includes a central processing unit (CPU), read-only memory (ROM), random access memory (RAM), and the like. The controller 500 controls operation of each unit of the laser processing device 200.

As an example, in the laser processing device 200, a modified region is formed within the object to be processed 1 along each of the lines to cut 5a and 5b (see FIG. 8) as follows.

First, the object to be processed 1 is supported on the support table 230 such that a back surface 1b (see FIG. 8) of the object to be processed 1 becomes the laser light entrance surface, and each of the lines to cut 5a of the object to be processed 1 is aligned in a direction parallel to the X-axis direction. Subsequently, the laser converging unit 400 is moved by the second moving mechanism 240 such that the converging point of the laser light L is located at a position apart from the laser light entrance surface of the object to be processed 1 by a predetermined distance within the object to be processed 1. Subsequently, while a constant distance is maintained between the laser light entrance surface of the object to be processed 1 and the converging point of the laser light L, the converging point of the laser light L is relatively moved along each line to cut 5a. Thus, the modified region is formed within the object to be processed 1 along each of the lines to cut 5a.

When the formation of the modified region along each of the lines to cut 5a is completed, the support table 230 is rotated by the first moving mechanism 220, and each of the lines to cut 5b of the object to be processed 1 is aligned in the direction parallel to the X-axis direction. Subsequently, the laser converging unit 400 is moved by the second moving mechanism 240 such that the converging point of the laser light L is located at a position apart from the laser light entrance surface of the object to be processed 1 by a predetermined distance within the object to be processed 1. Subsequently, while a constant distance is maintained between the laser light entrance surface of the object to be processed 1 and the converging point of the laser light L, the converging point of the laser light L is relatively moved along each line to cut 5b. Thus, the modified region is formed within the object to be processed 1 along each line to cut 5b.

As described above, in the laser processing device 200, the direction parallel to the X-axis direction is a processing direction (scanning direction of the laser light L). Note that, the relative movement of the converging point of the laser light L along each line to cut 5a and the relative movement of the converging point of the laser light L along each line to cut 5b are performed by the movement of the support table 230 along the X-axis direction by the first moving mechanism 220. In addition, the relative movement of the converging point of the laser light L between the lines to cut 5a and the relative movement of the converging point of the laser light L between the lines to cut 5b are performed by the movement of the support table 230 along the Y-axis direction by the first moving mechanism 220.

Figure 9:
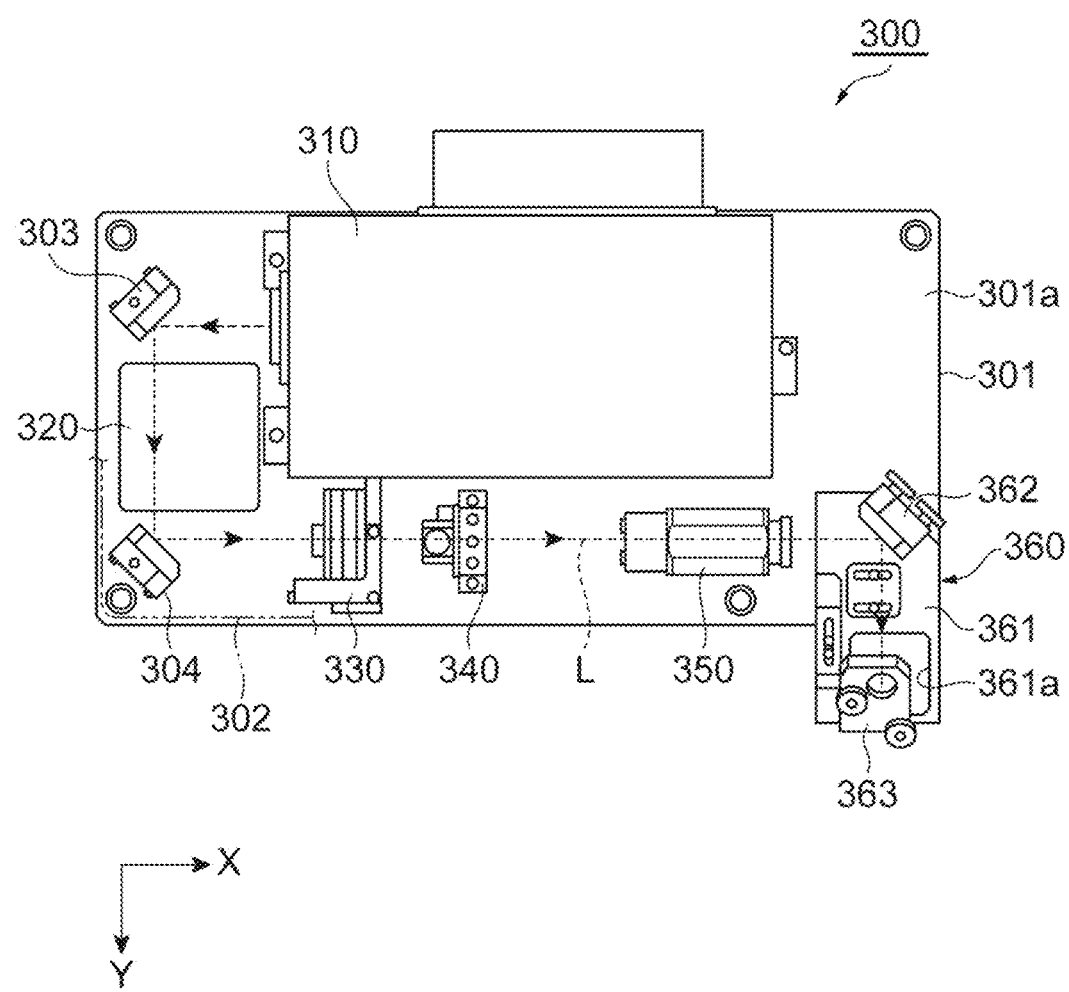
FIG. 9 is a sectional view of a laser output unit taken along the XY plane of FIG. 7.

As illustrated in FIG. 9, the laser output unit 300 includes a mounting base 301, a cover 302, and a plurality of mirrors 303 and 304. Further, the laser output unit 300 includes a laser oscillator (laser light source) 310, a shutter 320, a λ/2 wave plate unit 330, a polarizing plate unit 340, a beam expander 350, and a mirror unit 360.

The mounting base 301 supports the plurality of mirrors 303 and 304, the laser oscillator 310, the shutter 320, the λ/2 wave plate unit 330, the polarizing plate unit 340, the beam expander 350, and the mirror unit 360. The plurality of mirrors 303 and 304, the laser oscillator 310, the shutter 320, the λ2 wave plate unit 330, the polarizing plate unit 340, the beam expander 350, and the mirror unit 360 are attached to a main surface 301a of the mounting base 301. The mounting base 301 is a planar member and is detachable with respect to the device frame 210 (see FIG. 7). The laser output unit 300 is attached to the device frame 210 via the mounting base 301. That is, the laser output unit 300 is detachable with respect to the device frame 210.

The cover 302 covers the plurality of mirrors 303 and 304, the laser oscillator 310, the shutter 320, the λ/2 wave plate unit 330, the polarizing plate unit 340, the beam expander 350, and the mirror unit 360 on the main surface 301a of the mounting base 301. The cover 302 is detachable with respect to the mounting base 301.

The laser oscillator 310 oscillates linearly polarized laser light L in a pulsating manner along the X-axis direction. The wavelength of the laser light L emitted from the laser oscillator 310 is included in any of the wavelength bands of from 500 nm to 550 nm, from 1000 nm to 1150 nm, or from 1300 nm to 1400 nm. The laser light L in the wavelength band of from 500 nm to 550 nm is suitable for internal absorption type laser processing on a substrate made of sapphire, for example. The laser light L in each of the wavelength bands of from 1000 nm to 1150 nm and from 1300 nm to 1400 nm is suitable for internal absorption type laser processing on a substrate made of silicon, for example. The polarization direction of the laser light L emitted from the laser oscillator 310 is, for example, a direction parallel to the Y-axis direction. The laser light L emitted from the laser oscillator 310 is reflected by the mirror 303 and enters the shutter 320 along the Y-axis direction.

In the laser oscillator 310, ON/OFF of the output of the laser light L is switched as follows. In a case where the laser oscillator 310 includes a solid state laser, ON/OFF of a Q switch (acousto-optic modulator (AOM), electro-optic modulator (EOM), or the like) provided in a resonator is switched, whereby ON/OFF of the output of the laser light L is switched at high speed. In a case where the laser oscillator 310 includes a fiber laser, ON/OFF of the output of a semiconductor laser constituting a seed laser and an amplifier (excitation) laser is switched, whereby ON/OFF of the output of the laser light L is switched at high speed. In a case where the laser oscillator 310 uses an external modulation device, ON/OFF of the external modulation device (AOM, EOM, or the like) provided outside the resonator is switched, whereby ON/OFF of the output of the laser light L is switched at high speed.

The shutter 320 opens and closes the optical path of the laser light L by a mechanical mechanism. Switching ON/OFF of the output of the laser light L from the laser output unit 300 is performed by switching ON/OFF of the output of the laser light L in the laser oscillator 310 as described above, and the shutter 320 is provided, whereby the laser light L is prevented from being unexpectedly emitted from the laser output unit 300, for example. The laser light L having passed through the shutter 320 is reflected by the mirror 304 and sequentially enters the λ/2 wave plate unit 330 and the polarizing plate unit 340 along the X-axis direction.

The λ/2 wave plate unit 330 and the polarizing plate unit 340 function as the output adjusting unit configured to adjust the output (light intensity) of the laser light L. In addition, the λ/2 wave plate unit 330 and the polarizing plate unit 340 each function as the polarization direction adjusting unit configured to adjust the polarization direction of the laser light L. The laser light L having sequentially passed through the λ/2 wave plate unit 330 and the polarizing plate unit 340 enters the beam expander 350 along the X-axis direction.

The beam expander 350 collimates the laser light L while adjusting the diameter of the laser light L. The laser light L having passed through the beam expander 350 enters the mirror unit 360 along the X-axis direction.

The mirror unit 360 includes a support base 361 and a plurality of mirrors 362 and 363. The support base 361 supports the plurality of mirrors 362 and 363. The support base 361 is attached to the mounting base 301 so as to be position adjustable along the X-axis direction and the Y-axis direction. The mirror (first mirror) 362 reflects the laser light L having passed through the beam expander 350 in the Y-axis direction. The mirror 362 is attached to the support base 361 such that its reflective surface is angle adjustable around an axis parallel to the Z-axis, for example.

The mirror (second mirror) 363 reflects the laser light L reflected by the mirror 362 in the Z-axis direction. The mirror 363 is attached to the support base 361 such that its reflective surface is angle adjustable around an axis parallel to the X-axis, for example, and is position adjustable along the Y-axis direction. The laser light L reflected by the mirror 363 passes through an opening 361a formed in the support base 361 and enters the laser converging unit 400 (see FIG. 7) along the Z-axis direction. That is, an emission direction of the laser light L by the laser output unit 300 coincides with a moving direction of the laser converging unit 400. As described above, each of the mirrors 362 and 363 includes a mechanism configured to adjust the angle of the reflective surface.

In the mirror unit 360, the position adjustment of the support base 361 with respect to the mounting base 301, the position adjustment of the mirror 363 with respect to the support base 361, and the angle adjustment of the reflective surface of each of the mirrors 362 and 363 are performed, whereby the position and angle of the optical axis of the laser light L emitted from the laser output unit 300 are aligned with respect to the laser converging unit 400. That is, each of the plurality of mirrors 362 and 363 is a component configured to adjust the optical axis of the laser light L emitted from the laser output unit 300.

Figure 10:
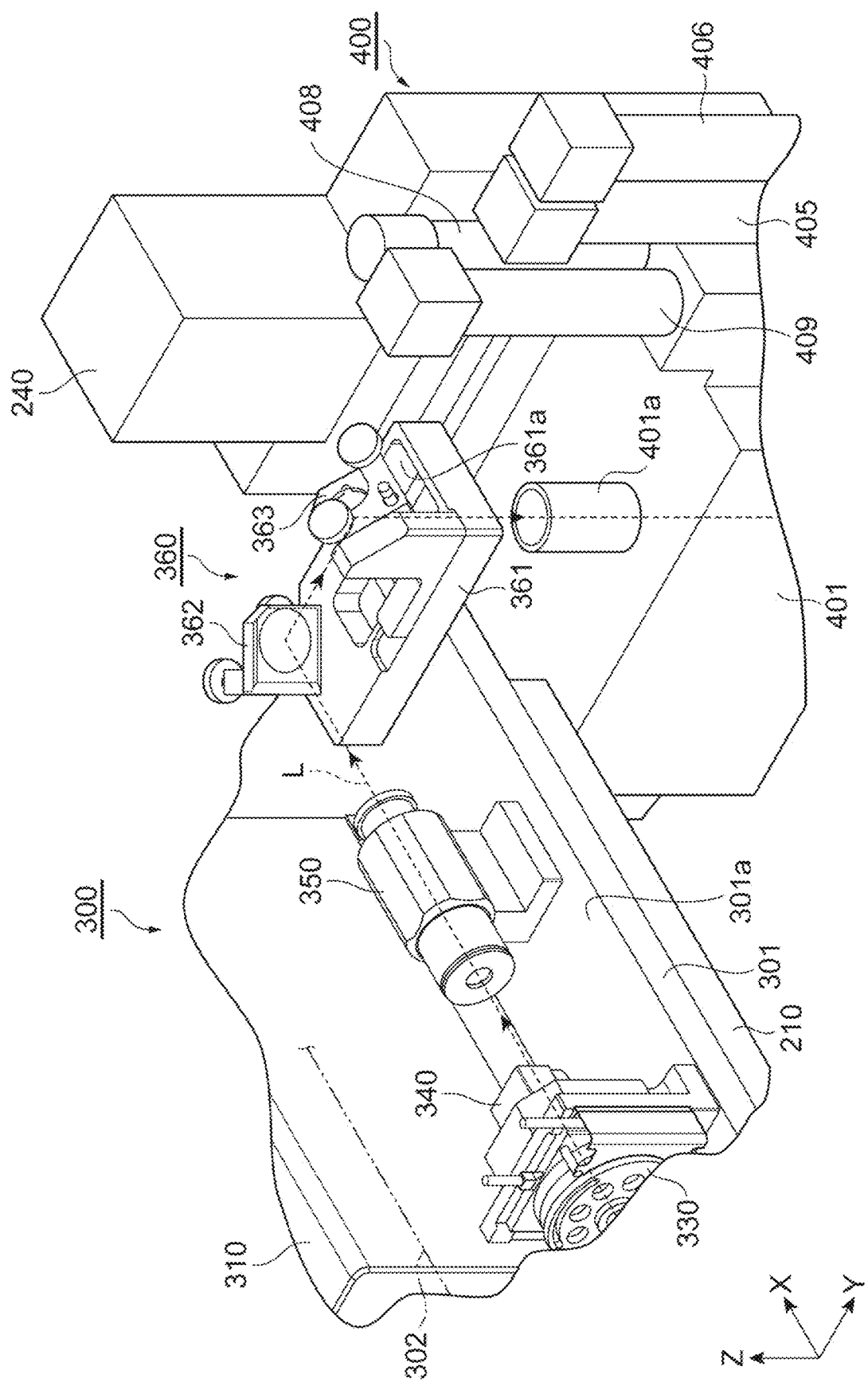
FIG. 10 is a perspective view of a part of the laser output unit and a laser converging unit in the laser processing device of FIG. 7.

As illustrated in FIG. 10, the laser converging unit 400 includes a housing 401. The housing 401 has a rectangular parallelepiped shape with the Y-axis direction as the longitudinal direction. The second moving mechanism 240 is attached to one side surface 401e of the housing 401 (see FIGS. 11 and 13). A cylindrical light entrance unit 401a is provided in the housing 401 so as to face the opening 361a of the mirror unit 360 in the Z-axis direction. The light entrance unit 401a allows the laser light L emitted from the laser output unit 300 to enter the housing 401. The mirror unit 360 and the light entrance unit 401a are separated from each other by a distance in which mutual contact does not occur when the laser converging unit 400 is moved along the Z-axis direction by the second moving mechanism 240.

Figure 11:
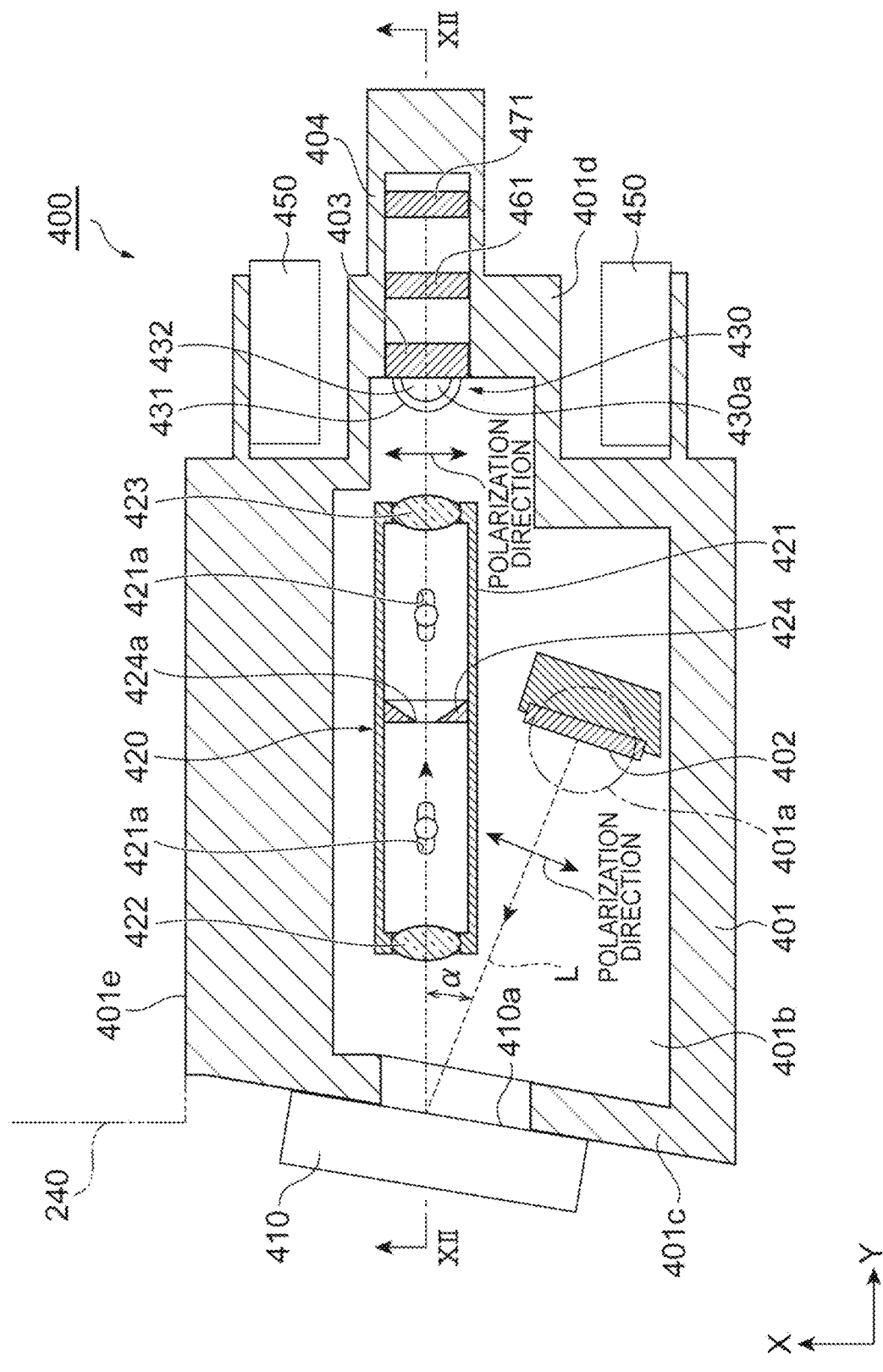
FIG. 11 is a sectional view of the laser converging unit taken along the XY plane of FIG. 7.
Figure 12:
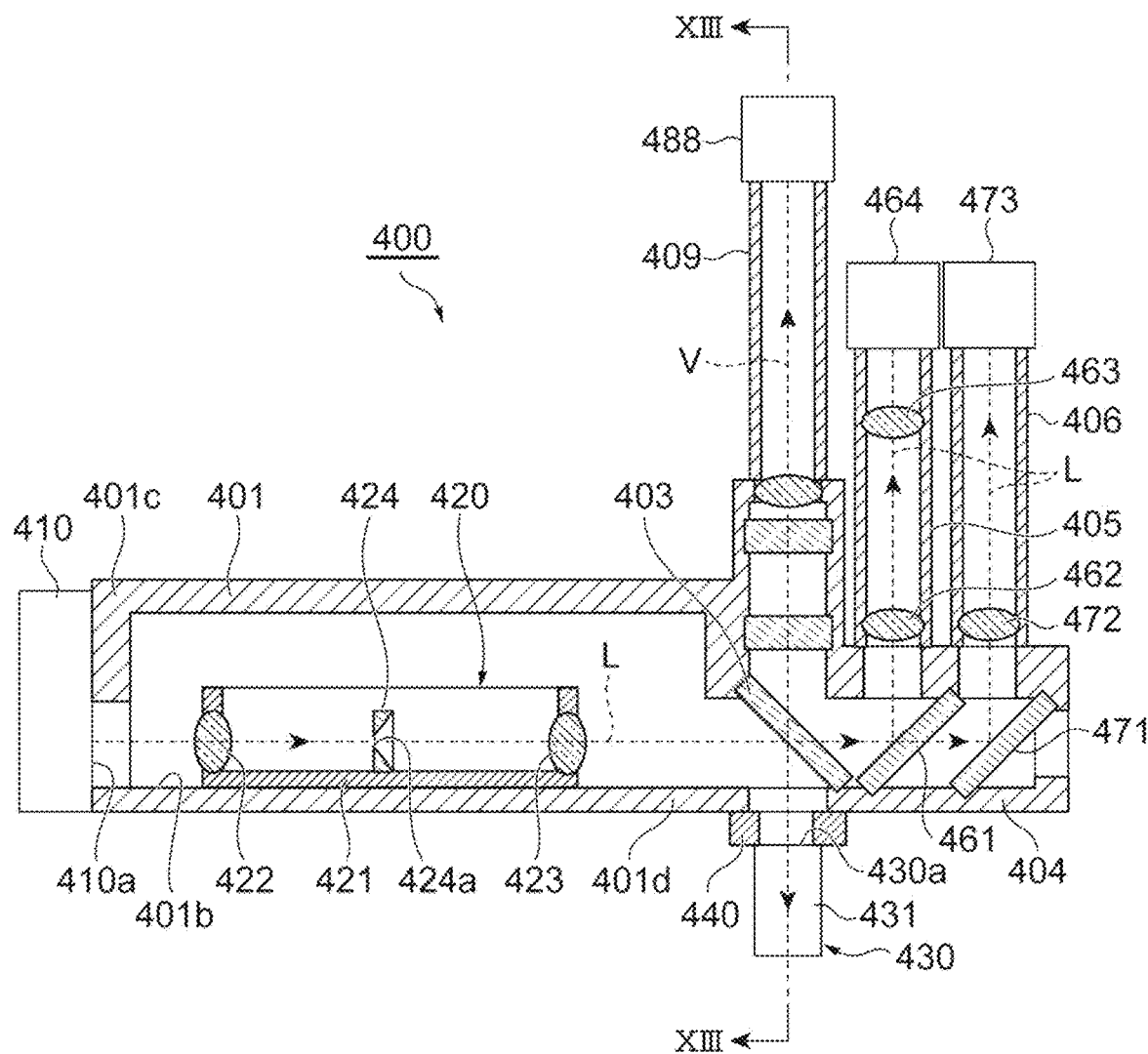
FIG. 12 is a sectional view of the laser converging unit taken along the line XII-XII of FIG. 11.

As illustrated in FIGS. 11 and 12, the laser converging unit 400 includes a mirror 402 and a dichroic mirror 403. Further, the laser converging unit 400 includes a reflective spatial light modulator 410, a 4f lens unit 420, a converging lens unit (objective lens) 430, a drive mechanism 440, and a pair of distance measuring sensors 450.

The mirror 402 is attached to a bottom surface 401b of the housing 401 so as to face the light entrance unit 401a in the Z-axis direction. The mirror 402 reflects the laser light L entering the housing 401 via the light entrance unit 401a in a direction parallel to the XY plane. The laser light L collimated by the beam expander 350 of the laser output unit 300 enters the mirror 402 along the Z-axis direction. That is, the laser light L as parallel light enters the mirror 402 along the Z-axis direction. For that reason, even if the laser converging unit 400 is moved along the Z-axis direction by the second moving mechanism 240, a constant state of the laser light L entering the mirror 402 along the Z-axis direction is maintained. The laser light L reflected by the mirror 402 enters the reflective spatial light modulator 410.

The reflective spatial light modulator 410 is attached to an end 401c of the housing 401 in the Y-axis direction in a state where the reflective surface 410a faces the inside of the housing 401. The reflective spatial light modulator 410 is, for example, a reflective liquid crystal (liquid crystal on silicon (LCOS)) spatial light modulator (SLM), and reflects the laser light L in the Y-axis direction while modulating the laser light L. The laser light L modulated and reflected by the reflective spatial light modulator 410 enters the 4f lens unit 420 along the Y-axis direction. Here, in a plane parallel to the XY plane, an angle α formed by an optical axis of the laser light L entering the reflective spatial light modulator 410 and an optical axis of the laser light L emitted from the reflective spatial light modulator 410, is an acute angle (for example, from 10° to 60°). That is, the laser light L is reflected at an acute angle along the XY plane in the reflective spatial light modulator 410. This is for suppressing an incident angle and a reflection angle of the laser light L to suppress the degradation of diffraction efficiency, and for sufficiently exerting performance of the reflective spatial light modulator 410. Note that, in the reflective spatial light modulator 410, for example, the thickness of a light modulation layer in which a liquid crystal is used is extremely thin as several micrometers to several tens of micrometers, so that the reflective surface 410a can be regarded as substantially the same as a light entering and exiting surface of the light modulation layer.

The 4f lens unit 420 includes a holder 421, a lens 422 on the reflective spatial light modulator 410 side, a lens 423 on the converging lens unit 430 side, and a slit member 424. The holder 421 holds a pair of the lenses 422 and 423 and the slit member 424. The holder 421 maintains a constant mutual positional relationship between the pair of lenses 422 and 423 and the slit member 424 in a direction along the optical axis of the laser light L. The pair of lenses 422 and 423 constitutes a double telecentric optical system in which the reflective surface 410a of the reflective spatial light modulator 410 and an entrance pupil plane (pupil plane) 430a of the converging lens unit 430 are in an imaging relationship.

Thus, an image of the laser light L on the reflective surface 410a of the reflective spatial light modulator 410 (an image of the laser light L modulated in the reflective spatial light modulator 410) is transferred to (imaged on) the entrance pupil plane 430a of the converging lens unit 430. A slit 424a is formed in the slit member 424. The slit 424a is located between the lens 422 and the lens 423 and near a focal plane of the lens 422. Unnecessary part of the laser light L modulated and reflected by the reflective spatial light modulator 410 is blocked by the slit member 424. The laser light L having passed through the 4f lens unit 420 enters the dichroic mirror 403 along the Y-axis direction.

The dichroic mirror 403 reflects most (for example, from 95% to 99.5%) of the laser light L in the Z-axis direction and transmits part (for example, from 0.5% to 5%) of the laser light L along the Y-axis direction. Most of the laser light L is reflected at a right angle along the ZX plane in the dichroic mirror 403. The laser light L reflected by the dichroic mirror 403 enters the converging lens unit 430 along the Z-axis direction.

The converging lens unit 430 is attached to an end 401d (an end on the opposite side from the end 401c) of the housing 401 in the Y-axis direction via the drive mechanism 440. The converging lens unit 430 includes a holder 431 and a plurality of lenses 432. The holder 431 holds the plurality of lenses 432. The plurality of lenses 432 converges the laser light L at the object to be processed 1 (see FIG. 7) supported by the support table 230. The drive mechanism 440 moves the converging lens unit 430 along the Z-axis direction by driving force of a piezoelectric device.

The pair of distance measuring sensors 450 is attached to the end 401d of the housing 401 so as to be respectively located on both sides of the converging lens unit 430 in the X-axis direction. Each of the distance measuring sensors 450 emits light for distance measurement (for example, laser light) to the laser light entrance surface of the object to be processed 1 (see FIG. 7) supported by the support table 230, and detects the light for distance measurement reflected by the laser light entrance surface, thereby acquiring displacement data of the laser light entrance surface of the object to be processed 1. Note that, for the distance measuring sensors 450, sensors can be used of a triangulation method, a laser confocal method, a white confocal method, a spectral interference method, an astigmatism method, and the like.

In the laser processing device 200, as described above, the direction parallel to the X-axis direction is the processing direction (scanning direction of the laser light L). For that reason, when the converging point of the laser light L is relatively moved along each of the lines to cut 5a and 5b, out of the pair of distance measuring sensors 450, one of the distance measuring sensors 450 being relatively advanced with respect to the converging lens unit 430 acquires the displacement data of the laser light entrance surface of the object to be processed 1 along each of the lines to cut 5a and 5b. Then, the drive mechanism 440 moves the converging lens unit 430 along the Z-axis direction on the basis of the displacement data acquired by the distance measuring sensors 450 such that a constant distance is maintained between the laser light entrance surface of the object to be processed 1 and the converging point of the laser light L.

The laser converging unit 400 includes a beam splitter 461, a pair of lenses 462 and 463, and a profile acquisition camera (intensity distribution acquisition unit) 464. The beam splitter 461 divides the laser light L transmitted through the dichroic mirror 403 into a reflection component and a transmission component. The laser light L reflected by the beam splitter 461 sequentially enters the pair of lenses 462 and 463 and the profile acquisition camera 464 along the Z-axis direction. The pair of lenses 462 and 463 constitutes a double telecentric optical system in which the entrance pupil plane 430a of the converging lens unit 430 and an imaging surface of the profile acquisition camera 464 are in an imaging relationship. Thus, an image of the laser light L on the entrance pupil plane 430a of the converging lens unit 430 is transferred to (imaged on) the imaging surface of the profile acquisition camera 464. As described above, the image of the laser light L on the entrance pupil plane 430a of the converging lens unit 430 is the image of the laser light L modulated in the reflective spatial light modulator 410. Therefore, in the laser processing device 200, an imaging result by the profile acquisition camera 464 is monitored, whereby an operation state of the reflective spatial light modulator 410 can be grasped.

Further, the laser converging unit 400 includes a beam splitter 471, a lens 472, and a camera 473 for monitoring an optical axis position of the laser light L. The beam splitter 471 divides the laser light L transmitted through the beam splitter 461 into a reflection component and a transmission component. The laser light L reflected by the beam splitter 471 sequentially enters the lens 472 and the camera 473 along the Z-axis direction. The lens 472 converges the entering laser light L on an imaging surface of the camera 473. In the laser processing device 200, while an imaging result by each of the cameras 464 and 473 is monitored, in the mirror unit 360, the position adjustment of the support base 361 with respect to the mounting base 301, the position adjustment of the mirror 363 with respect to the support base 361, and the angle adjustment of the reflective surface of each of the mirrors 362 and 363 are performed (see FIGS. 9 and 10), whereby a shift can be corrected of the optical axis of the laser light L entering the converging lens unit 430 (a positional shift of intensity distribution of the laser light with respect to the converging lens unit 430, and an angular shift of the optical axis of the laser light L with respect to the converging lens unit 430).

The plurality of beam splitters 461 and 471 is arranged in a cylindrical body 404 extending along the Y-axis direction from the end 401d of the housing 401. The pair of lenses 462 and 463 is arranged in a cylindrical body 405 erected on the cylindrical body 404 along the Z-axis direction, and the profile acquisition camera 464 is arranged at an end of the cylindrical body 405. The lens 472 is arranged in a cylindrical body 406 erected on the cylindrical body 404 along the Z-axis direction, and the camera 473 is arranged at an end of the cylindrical body 406. The cylindrical body 405 and the cylindrical body 406 are arranged side by side in the Y-axis direction. Note that, the laser light L transmitted through the beam splitter 471 may be absorbed by a damper or the like provided at an end of the cylindrical body 404, or may be used for an appropriate purpose.

As illustrated in FIGS. 12 and 13, the laser converging unit 400 includes a visible light source 481, a plurality of lenses 482, a reticle 483, a mirror 484, a semitransparent mirror 485, a beam splitter 486, a lens 487, and an observation camera 488. The visible light source 481 emits visible light V along the Z-axis direction. The plurality of lenses 482 collimates the visible light V emitted from the visible light source 481. The reticle 483 gives a scale line to the visible light V. The mirror 484 reflects the visible light V collimated by the plurality of lenses 482 in the X-axis direction. The semitransparent mirror 485 divides the visible light V reflected by the mirror 484 into a reflection component and a transmission component. The visible light V reflected by the semitransparent mirror 485 is sequentially transmitted through the beam splitter 486 and the dichroic mirror 403 along the Z-axis direction, and is emitted via the converging lens unit 430 to the object to be processed 1 supported by the support table 230 (see FIG. 7).

The visible light V emitted to the object to be processed 1 is reflected by the laser light entrance surface of the object to be processed 1, enters the dichroic mirror 403 via the converging lens unit 430, and is transmitted through the dichroic mirror 403 along the Z-axis direction. The beam splitter 486 divides the visible light V transmitted through the dichroic mirror 403 into a reflection component and a transmission component. The visible light V transmitted through the beam splitter 486 is transmitted through the semitransparent mirror 485 and sequentially enters the lens 487 and the observation camera 488 along the Z-axis direction. The lens 487 converges the entering visible light V on an imaging surface of the observation camera 488. In the laser processing device 200, an imaging result by the observation camera 488 is observed, whereby a state of the object to be processed 1 can be grasped.

The mirror 484, the semitransparent mirror 485, and the beam splitter 486 are arranged in a holder 407 attached on the end 401d of the housing 401. The plurality of lenses 482 and the reticle 483 are arranged in a cylindrical body 408 erected on the holder 407 along the Z-axis direction, and the visible light source 481 is arranged at an end of the cylindrical body 408. The lens 487 is arranged in a cylindrical body 409 erected on the holder 407 along the Z-axis direction, and the observation camera 488 is arranged at an end of the cylindrical body 409. The cylindrical body 408 and the cylindrical body 409 are arranged side by side in the X-axis direction. Note that, each of the visible light V transmitted through the semitransparent mirror 485 along the X-axis direction and the visible light V reflected in the X-axis direction by the beam splitter 486 may be absorbed by a damper or the like provided on a wall portion of the holder 407, or may be used for an appropriate purpose.

In the laser processing device 200, replacement of the laser output unit 300 is assumed. This is because the wavelength of the laser light L suitable for processing varies depending on the specifications of the object to be processed 1, processing conditions, and the like. For that reason, a plurality of the laser output units 300 is prepared having respective wavelengths of emitting laser light L different from each other. Here, prepared are the laser output unit 300 in which the wavelength of the emitting laser light L is included in the wavelength band of from 500 nm to 550 nm, the laser output unit 300 in which the wavelength of the emitting laser light L is included in the wavelength band of from 1000 nm to 1150 nm, and the laser output unit 300 in which the wavelength of the emitting laser light L is included in the wavelength band of from 1300 nm to 1400 nm.

On the other hand, in the laser processing device 200, replacement of the laser converging unit 400 is not assumed. This is because the laser converging unit 400 is adapted to multiple wavelengths (adapted to a plurality of wavelength bands non-contiguous with each other). Specifically, the mirror 402, the reflective spatial light modulator 410, the pair of lenses 422 and 423 of the 4f lens unit 420, the dichroic mirror 403, the lens 432 of the converging lens unit 430, and the like are adapted to the multiple wavelengths.

Here, the laser converging unit 400 is adapted to the wavelength bands of from 500 nm to 550 nm, from 1000 nm to 1150 nm, and from 1300 nm to 1400 nm. This is implemented by designing the components of the laser converging unit 400 so as to satisfy desired optical performance, such as coating the components of the laser converging unit 400 with a predetermined dielectric multilayer film. Note that, in the laser output unit 300, the λ/2 wave plate unit 330 includes a λ/2 wave plate, and the polarizing plate unit 340 includes a polarizing plate. The λ/2 wave plate and the polarizing plate are optical devices having high wavelength dependence. For that reason, the λ/2 wave plate unit 330 and the polarizing plate unit 340 are provided in the laser output unit 300 as different components for each wavelength band.

[Optical Path and Polarization Direction of Laser Light in Laser Processing Device]

In the laser processing device 200, as illustrated in FIG. 11, the polarization direction of the laser light L converged at the object to be processed 1 supported by the support table 230 is a direction parallel to the X-axis direction, and coincides with the processing direction (scanning direction of the laser light L). Here, in the reflective spatial light modulator 410, the laser light L is reflected as P-polarized light. This is because in a case where a liquid crystal is used for the light modulation layer of the reflective spatial light modulator 410, when the liquid crystal is oriented such that the liquid crystal molecules are inclined in a surface parallel to the plane including the optical axis of the laser light L entering and exiting the reflective spatial light modulator 410, phase modulation is applied to the laser light L in a state where the rotation of the plane of polarization is suppressed (for example, see Japanese Patent No. 3878758).

On the other hand, in the dichroic mirror 403, the laser light L is reflected as S-polarized light. This is because, for example, when the laser light L is reflected as the S-polarized light rather than when the laser light L is reflected as the P-polarized light, the number of coatings is reduced of the dielectric multilayer film for making the dichroic mirror 403 adapt to the multiple wavelengths, and designing of the dichroic mirror 403 becomes easier.

Therefore, in the laser converging unit 400, the optical path from the mirror 402 via the reflective spatial light modulator 410 and the 4f lens unit 420 to the dichroic mirror 403 is set along the XY plane, and the optical path from the dichroic mirror 403 to the converging lens unit 430 is set along the Z-axis direction.

As illustrated in FIG. 9, in the laser output unit 300, the optical path of the laser light L is set along the X-axis direction or the Y-axis direction. Specifically, the optical path from the laser oscillator 310 to the mirror 303, and the optical path from the mirror 304 via the λ/2 wave plate unit 330, the polarizing plate unit 340, and the beam expander 350 to the mirror unit 360 are set along the X-axis direction, and the optical path from the mirror 303 via the shutter 320 to the mirror 304, and the optical path from the mirror 362 to the mirror 363 in the mirror unit 360 are set along the Y-axis direction.

Here, as illustrated in FIG. 11, the laser light L having traveled to the laser converging unit 400 from the laser output unit 300 along the Z-axis direction is reflected by the mirror 402 in a direction parallel to the XY plane, and enters the reflective spatial light modulator 410. At this time, in the plane parallel to the XY plane, an acute angle α is formed by the optical axis of the laser light L entering the reflective spatial light modulator 410 and the optical axis of the laser light L emitted from the reflective spatial light modulator 410. On the other hand, as described above, in the laser output unit 300, the optical path of the laser light L is set along the X-axis direction or the Y-axis direction.

Therefore, in the laser output unit 300, it is necessary to cause the λ/2 wave plate unit 330 and the polarizing plate unit 340 to function not only as the output adjusting unit configured to adjust the output of the laser light L but also as the polarization direction adjusting unit configured to adjust the polarization direction of the laser light L.

[Reflective Spatial Light Modulator]

Figure 14:
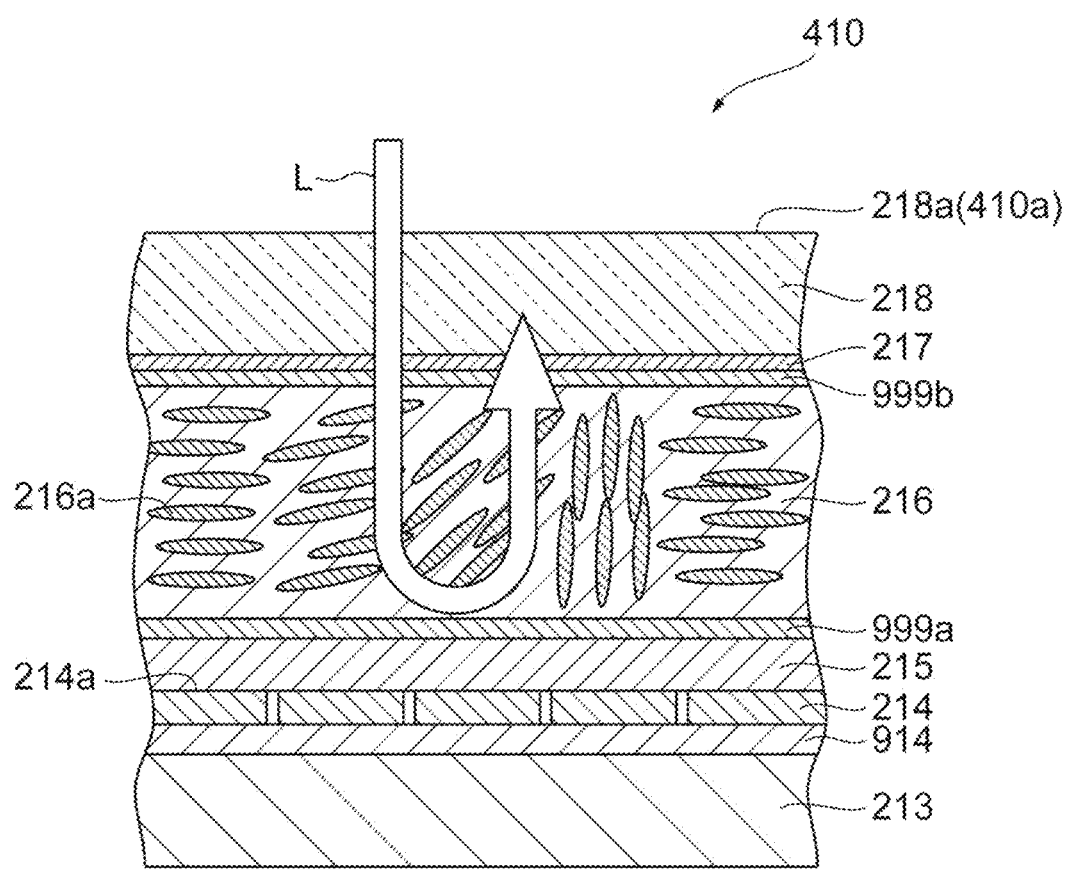
FIG. 14 is a partial sectional view of a reflective spatial light modulator in the laser processing device of FIG. 7.

As illustrated in FIG. 14, the reflective spatial light modulator 410 includes a silicon substrate 213, a drive circuit layer 914, a plurality of pixel electrodes 214, a reflective film 215 such as a dielectric multilayer mirror, an alignment film 999a, a liquid crystal layer (display) 216, an alignment film 999b, a transparent conductive film 217, and a transparent substrate 218 such as a glass substrate, which are layered in that order.

The transparent substrate 218 has a front surface 218a, and the front surface 218a forms the reflective surface 410a of the reflective spatial light modulator 410. The transparent substrate 218 is made of a light transmitting material such as glass, for example, and transmits the laser light L having a predetermined wavelength and entering from the front surface 218a of the reflective spatial light modulator 410 to the inside of the reflective spatial light modulator 410. The transparent conductive film 217 is formed on a back surface of the transparent substrate 218, and includes a conductive material (for example, ITO) that transmits the laser light L therethrough.

The plurality of pixel electrodes 214 is arranged in a matrix on the silicon substrate 213 along the transparent conductive film 217. Each pixel electrode 214 is made of a metal material such as aluminum, for example, while its front surface 214a is processed flat and smooth. The plurality of pixel electrodes 214 is driven by an active matrix circuit provided in the drive circuit layer 914.

The active matrix circuit is provided between the plurality of pixel electrodes 214 and the silicon substrate 213, and controls an applied voltage to each of the pixel electrodes 214 in accordance with a light image to be output from the reflective spatial light modulator 410. Such an active matrix circuit includes a first driver circuit configured to control the applied voltage for pixel rows arranged in the X-axis direction, and a second driver circuit configured to control the applied voltage for pixel rows arranged in the Y-axis direction, which are not illustrated, for example, and a predetermined voltage is applied to the pixel electrode 214 of a pixel specified by the driver circuits, by a spatial light modulator controller 502 (see FIG. 16) in the controller 500 to be described later.

The alignment films 999a, 999b are arranged on both end surfaces of the liquid crystal layer 216, respectively, so as to align a group of liquid crystal molecules in a fixed direction. The alignment films 999a, 999b are made of a polymer material such as polyimide, of which surfaces coming into contact with the liquid crystal layer 216 are subjected to rubbing, and the like.

The liquid crystal layer 216 is arranged between the plurality of pixel electrodes 214 and the transparent conductive film 217 and modulates the laser light L according to an electric field formed between each pixel electrode 214 and the transparent conductive film 217. That is, when a voltage is applied to the pixel electrodes 214 by the active matrix circuit of the drive circuit layer 914, an electric field is formed between the transparent conductive film 217 and the pixel electrodes 214, and the alignment direction of liquid crystal molecules 216a changes according to a magnitude of the electric field formed in the liquid crystal layer 216. When the laser light L enters the liquid crystal layer 216 through the transparent substrate 218 and the transparent conductive film 217, the laser light L is modulated by the liquid crystal molecules 216a while passing through the liquid crystal layer 216, and reflected by the reflective film 215, and then modulated again by the liquid crystal layer 216, and emitted.

At this time, the voltage applied to each of the pixel electrodes 214 is controlled by the spatial light modulator controller 502 (see FIG. 16) to be described later, and, in accordance with the voltage, a refractive index changes in a portion sandwiched between the transparent conductive film 217 and each of the pixel electrodes 214 in the liquid crystal layer 216 (the refractive index changes of the liquid crystal layer 216 at a position corresponding to each pixel). Due to the change in the refractive index, the phase of the laser light L can be changed for each pixel of the liquid crystal layer 216 in accordance with the voltage applied. That is, phase modulation corresponding to the hologram pattern can be applied by the liquid crystal layer 216 for each pixel.

In other words, a modulation pattern as the hologram pattern applying the modulation can be displayed on the liquid crystal layer 216 of the reflective spatial light modulator 410. The wavefront is adjusted of the laser light L that enters and is transmitted through the modulation pattern, and shifts occur in phases of components of individual rays constituting the laser light L in a predetermined direction orthogonal to their traveling direction. Therefore, the laser light L can be modulated (for example, intensity, amplitude, phase, and polarization of the laser light L can be modulated) by appropriately setting the modulation pattern to be displayed in the reflective spatial light modulator 410.

[4f Lens Unit]

Figure 15:
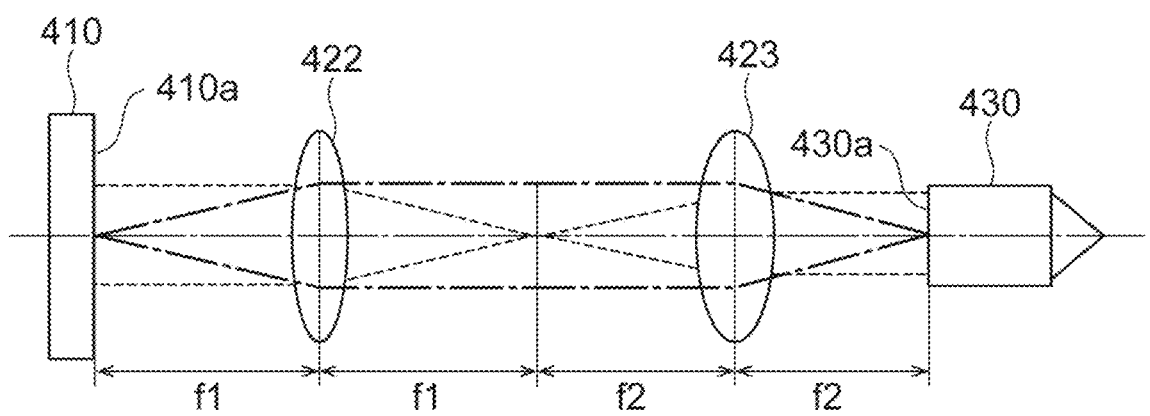
FIG. 15 is a diagram illustrating an optical arrangement relationship among a reflective spatial light modulator, a 4f lens unit, and a converging lens unit in the laser converging unit of FIG. 11.

As described above, the pair of lenses 422 and 423 of the 4f lens unit 420 constitutes the double telecentric optical system in which the reflective surface 410a of the reflective spatial light modulator 410 and the entrance pupil plane 430a of the converging lens unit 430 are in the imaging relationship. Specifically, as illustrated in FIG. 15, the distance of the optical path between the center of the lens 422 on the reflective spatial light modulator 410 side and the reflective surface 410a of the reflective spatial light modulator 410 is a first focal length f1 of the lens 422, the distance of the optical path between the center of the lens 423 on the converging lens unit 430 side and the entrance pupil plane 430a of the converging lens unit 430 is a second focal length f2 of the lens 423, and the distance of the optical path between the center of the lens 422 and the center of the lens 423 is a sum of the first focal length f1 and the second focal length f2 (that is, f1+f2). In the optical path from the reflective spatial light modulator 410 to the converging lens unit 430, the optical path between the pair of lenses 422 and 423 is a straight line.

In the laser processing device 200, from a viewpoint of increasing an effective diameter of the laser light L on the reflective surface 410a of the reflective spatial light modulator 410, a magnification M of the double telecentric optical system satisfies $0.5<M<1$ (reduction system). As the effective diameter is increased of the laser light L on the reflective surface 410a of the reflective spatial light modulator 410, the laser light L is modulated with a high-precision phase pattern. From a viewpoint of inhibiting the optical path from becoming longer of the laser light L from the reflective spatial light modulator 410 to the converging lens unit 430, it is possible to set $0.6 \leq M \leq 0.95$. Here, (the magnification M of the double telecentric optical system)=(the size of the image on the entrance pupil plane 430a of the converging lens unit 430)/(the size of the object on the reflective surface 410a of the reflective spatial light modulator 410). In the case of the laser processing device 200, the magnification M of the double telecentric optical system, the first focal length f1 of the lens 422, and the second focal length f2 of the lens 423 satisfy M=f2/f1.

From a viewpoint of reducing the effective diameter of the laser light L on the reflective surface 410a of the reflective spatial light modulator 410, the magnification M of the double telecentric optical system may satisfy $1<M<2$ (enlargement system). As the effective diameter is reduced of the laser light L on the reflective surface 410a of the reflective spatial light modulator 410, the magnification can be reduced of the beam expander 350 (see FIG. 9), and in the plane parallel to the XY plane, the angle α (see FIG. 11) is reduced formed by the optical axis of the laser light L entering the spatial light modulator 410 and the optical axis of the laser light L emitted from the reflective spatial light modulator 410. From the viewpoint of inhibiting the optical path from becoming longer of the laser light L from the reflective spatial light modulator 410 to the converging lens unit 430, it is possible to set $1.05 \leq M \leq 1.7$.

Next, a main part of a laser processing device 200 according to a first embodiment will be described in detail.

Figure 16:
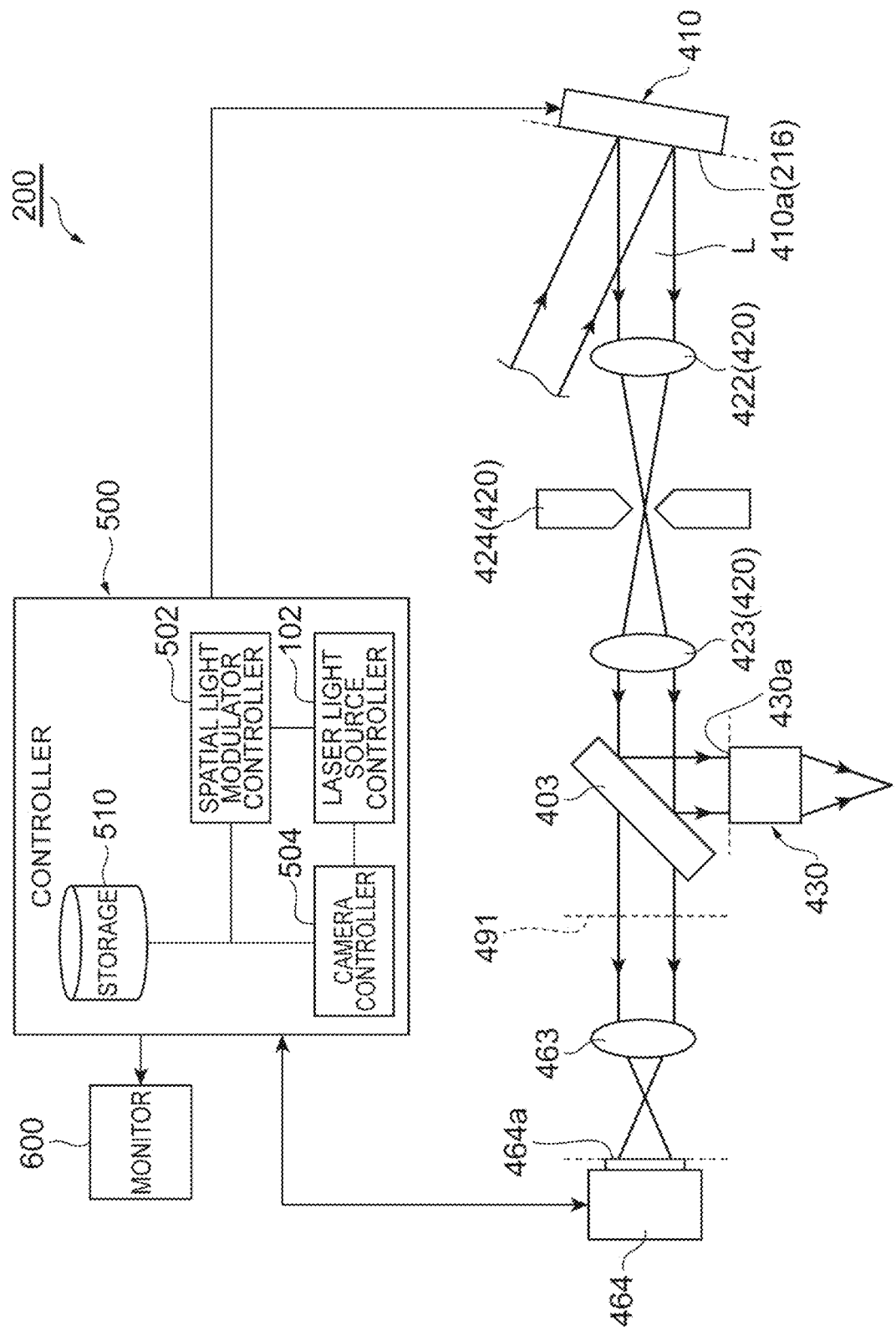
FIG. 16 is a schematic configuration diagram illustrating a main part of a laser processing device according to a first embodiment.
Figure 17:
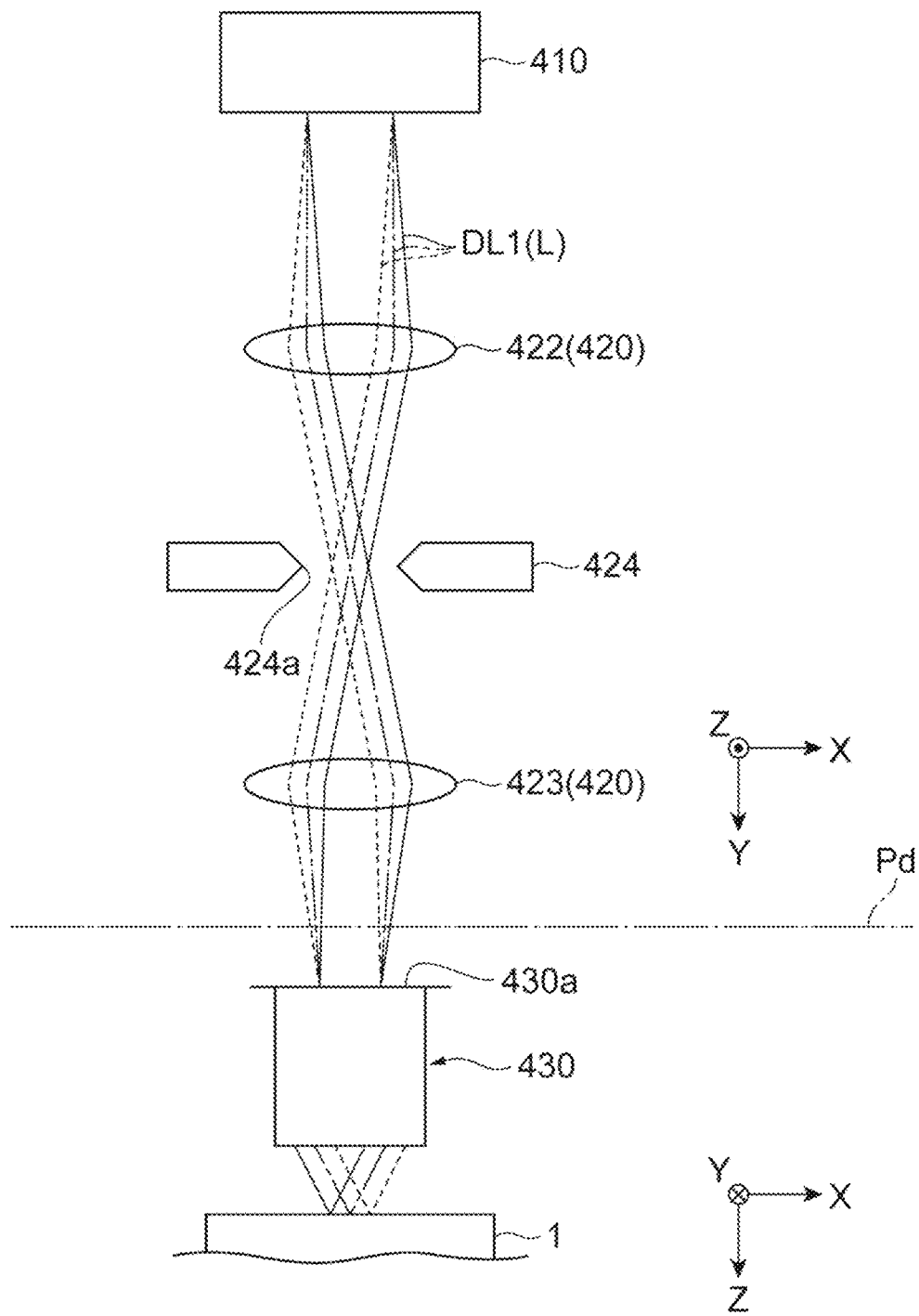
FIG. 17 is a diagram schematically illustrating an optical path of laser light between a reflective spatial light modulator illustrated in FIG. 16 and an object to be processed and each optical element on the optical path.

FIG. 16 is a schematic configuration diagram illustrating the main part of the laser processing device 200 according to the first embodiment. FIG. 17 is a diagram schematically illustrating an optical path of laser light between a reflective spatial light modulator illustrated in FIG. 16 and an object to be processed and each optical element on the optical path. In FIG. 17, a dichroic mirror 403 is omitted. After travelling along the Y-axis direction, for example, laser light L is reflected by the dichroic mirror 403 at a position Pd in the Z-axis direction, travels in the Z-axis direction, and then enters a converging lens unit 430.

As illustrated in FIGS. 16 and 17, the laser light L output from a laser output unit 300 (laser oscillator 310) enters a reflective spatial light modulator 410. The reflective spatial light modulator 410 modulates the entering laser light L according to a phase pattern displayed on a liquid crystal layer 216, and emits the modulated laser light. The laser light L emitted from the reflective spatial light modulator 410 is focused by a lens (focusing lens) 422 that is a relay lens of a 4f lens unit 420, and then collimated by a lens 423 that is a relay lens of the 4f lens unit 420 to enter a dichroic mirror 403. The laser light L entering the dichroic mirror 403 is branched into reflection light and transmission light. The laser light L reflected by the dichroic mirror 403 enters a converging lens unit 430.

That is, the laser processing device 200 includes the lens 422 arranged between the reflective spatial light modulator 410 and the converging lens unit 430 in the optical path of the laser light L. The laser light L entering the converging lens unit 430 is converged by the converging lens unit 430 onto an object to be processed 1. On the other hand, the laser light L transmitted through the dichroic mirror 403 is focused by the lens 463 that is a relay lens, and enters an imaging surface 464a of a profile acquisition camera 464.

A pair of lenses 422 and 423 relays the wavefront of the laser light L on a reflective surface 410a of the reflective spatial light modulator 410 to an entrance pupil plane 430a of the converging lens unit 430 and a conjugate plane 491 on the downstream side (rear stage) of the dichroic mirror 403. The lens 463 relays (images) the wavefront of the laser light L (the real image in the liquid crystal layer 216) relayed to the conjugate plane 491 by the pair of lenses 422 and 423 onto the imaging surface 464a of the profile acquisition camera 464. Thus, the liquid crystal layer 216, the entrance pupil plane 430a of the converging lens unit 430, the conjugate plane 491, and the imaging surface 464a of the profile acquisition camera 464 are conjugate with each other.

The profile acquisition camera 464 is an imaging device configured to obtain intensity distribution of the laser light L branched by the dichroic mirror 403. Specifically, the profile acquisition camera 464 captures, as a still image, an image (intensity distribution image) associated with the intensity distribution of the beam cross section of the laser light L emitted from the reflective spatial light modulator 410 and before entering the converging lens unit 430. The captured intensity distribution image is output to a controller 500. Examples of the profile acquisition camera 464 used include a complementary metal oxide semiconductor (CMOS) image sensor.

The controller 500 includes a laser light source controller 102 mentioned above, a spatial light modulator controller (controller) 502, a camera controller 504, and a storage 510. The laser light source controller 102 controls operation of the laser light oscillator 310. In addition, the laser light source controller 102 determines and sets the output of the laser light L generated by the laser oscillator 310 on the basis of processing conditions (irradiation conditions) for each laser processing along one line to cut 5. The processing conditions are input by an operator from an input unit such as a touch panel, for example. Examples of the processing conditions include a depth position at which a modified region 7 within an object to be processed 1 is formed, and a laser output.

The spatial light modulator controller 502 controls the phase pattern displayed on the liquid crystal layer 216 of the reflective spatial light modulator 410. FIG. 18 is a view illustrating an exemplary phase pattern displayed on the reflective spatial light modulator 410. (a) of FIG. 18 illustrates an entire phase pattern, and (b) of FIG. 18 is an enlarged view of the region RA of (a) of FIG. 18. As illustrated in FIG. 18, a phase pattern P0 displayed on the reflective spatial light modulator 410 includes a first pattern P1 and a second pattern P2. The first pattern P1 modulates a part of the laser light L entering the entrance pupil plane 430a of the converging lens unit 430. The second pattern P2 modulates the remainder of the laser light L, that is, the portion not entering the entrance pupil plane 430a (for example, the portion entering the peripheral portion of the entrance pupil plane 430a). This point will be described more specifically.

Figure 19:
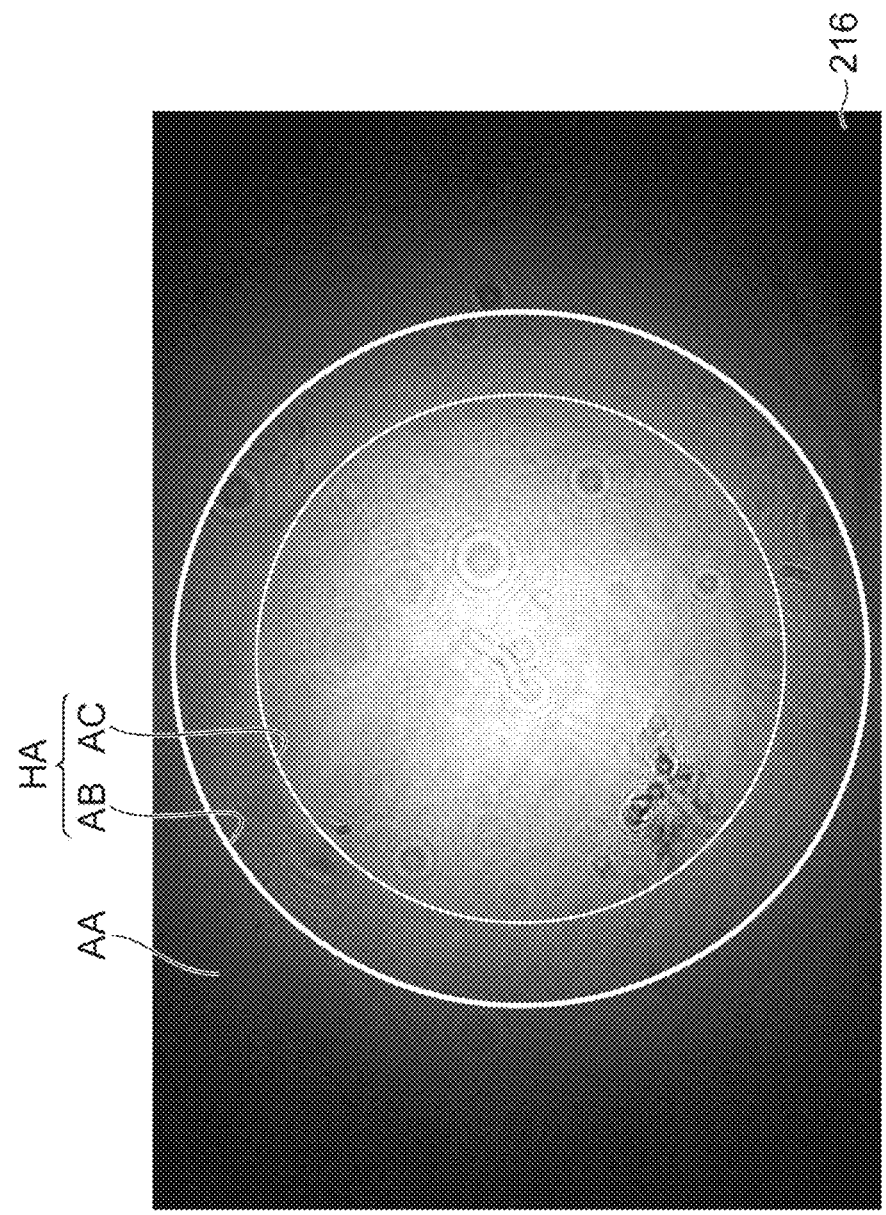
FIG. 19 is an image illustrating intensity distribution of the laser light on the reflective spatial light modulator.

FIG. 19 is an image illustrating intensity distribution of the laser light on the reflective spatial light modulator. As illustrated in FIG. 19, the liquid crystal layer 216 includes a region HA in which the laser light L is incident. The region HA includes a circular effective region AC, and an annular non-effective region AB outside the effective region AC. A part of the laser light L entering the effective region AC is effective light that enters the entrance pupil plane 430a of the converging lens unit 430 and is emitted onto the object to be processed 1. That is, the effective region AC is a region for modulating the effective light (a part of the laser light L). For example, the effective region AC is, in a case where the laser light L is a Gaussian beam, a circular region having a radius of a Gaussian beam radius w when the Gaussian beam radius w at which the intensity of the laser light L is 13.5 $(1/e^2)$% at the peak is used.

The remainder of the laser light L entering the non-effective region AB is non-effective light that does not enter the entrance pupil plane 430a of the converging lens unit 430 and is not emitted onto the object to be processed 1. That is, the non-effective region AB is a region for modulating the non-effective light (remainder of the laser light L). For example, the non-effective region AB is an annular region having the Gaussian beam radius w as an inner radius and having an outer radius of 1.22 times (=1.22 w) as the Gaussian beam radius w. The position 1.22 times the Gaussian beam radius w is a position at which the intensity of the laser light L is about 5% of the peak.

Note that the liquid crystal layer 216 includes a region AA outside the region HA. The region AA is a region in which the laser light L is not substantially incident. As an example, the region AA is a region in which the intensity of the laser light L becomes smaller than 5% of the peak in a case where the laser light L is the Gaussian beam.

The first pattern P1 illustrated in FIG. 18 is displayed in the effective region AC of the liquid crystal layer 216. Therefore, the first pattern P1 modulates the effective light in the laser light L. The second pattern P2 is displayed in the non-effective region AB and the region AA of the liquid crystal layer 216. Therefore, the second pattern P2 modulates the non-effective light in the laser light L.

Figure 20:
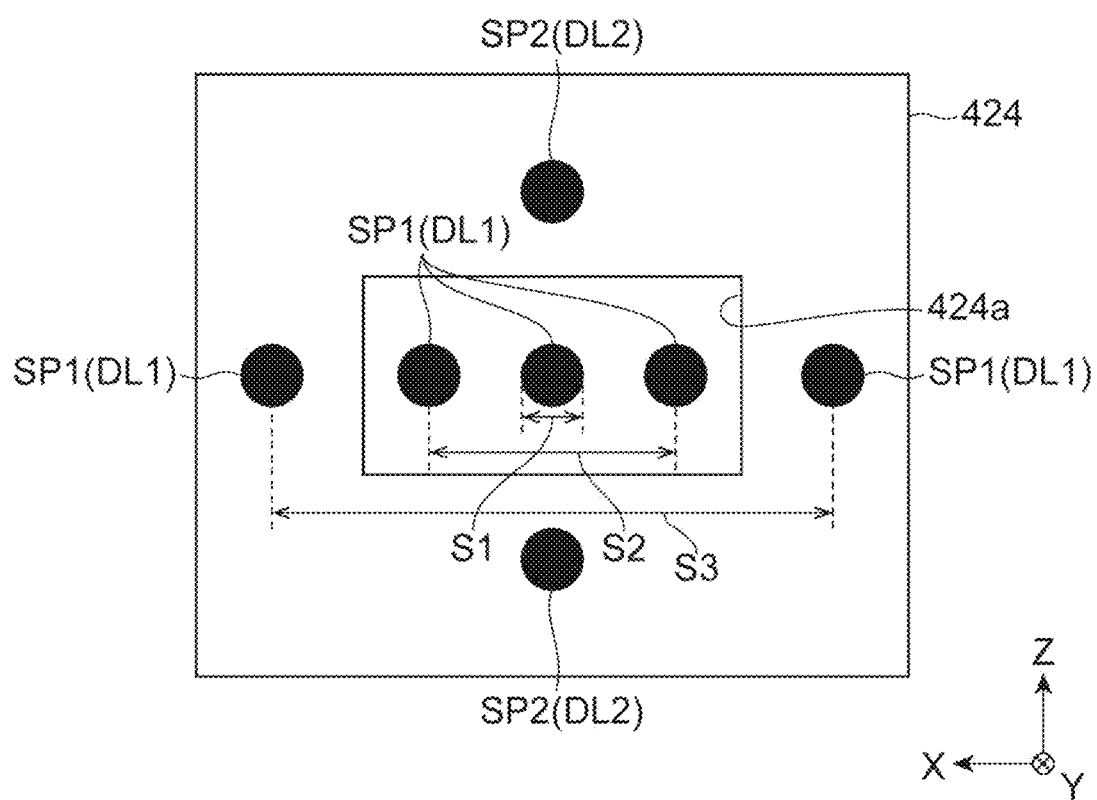
FIG. 20 is a diagram illustrating a slit member and a beam spot of diffracted light.

The first pattern P1 includes a first diffraction lattice pattern (another diffraction lattice pattern) G1 for branching a part of the laser light L (effective light) into a plurality of first diffracted light (another diffracted light) DL1 along a first direction (in this case, the X-axis direction: the scanning direction of the laser light L: the moving direction of the converging point of the laser light L relative to the object to be processed 1) (see FIGS. 17 and 20). Although the first pattern P1 is the diffraction lattice pattern in this case, another phase pattern such as an aberration correction pattern may be included (that is, another phase pattern may be superimposed on the diffraction lattice pattern). The first diffraction lattice pattern G1 is formed by arranging, in the first direction, a plurality of linear groove patterns along the second direction (in this case, the Z-axis direction) intersecting (orthogonal to) the first direction and the optical axis direction. Therefore, at the focal position on the rear side of the lens 422, a beam spot SP1 of a plurality of first diffracted light DL1 branched along the first direction is formed (see FIG. 20).

The second pattern P2 includes a second diffraction lattice pattern (diffraction lattice pattern) G2 for branching the remainder of the laser light L (non-effective light) into a plurality of second diffracted light (diffracted light) DL2 along the second direction (see FIG. 20). Although the second pattern P2 is the diffraction lattice pattern in this case, another phase pattern such as the aberration correction pattern may be included (that is, another phase pattern may be superimposed on the diffraction lattice pattern). The second diffraction lattice pattern G2 is formed by arranging, in the second direction, a plurality of linear groove patterns along the first direction. Therefore, at the focal position on the rear side of the lens 422, a beam spot SP2 of a plurality of second diffracted light DL2 branched along the second direction is formed (see FIG. 20).

Here, as illustrated in FIGS. 16 and 17, a slit member 424 is arranged at the focal position on the rear side of the lens 422 in the optical path of the laser light L. The slit member 424 shields a spatial frequency component (wide-angle diffracted light) of a certain value or more in the phase modulation of the laser light L, and allows a spatial frequency component less than the certain value in the phase modulation of the laser light L to pass. For example, in the slit member 424, a size of an opening is set such that the spatial frequency component of the certain value or more is shielded. For example, in a case where the phase pattern including the diffraction lattice pattern is displayed on the reflective spatial light modulator 410 (liquid crystal layer 216), the slit member 424 blocks at least a part of the diffracted light of the laser light L diffracted in accordance with the diffraction lattice pattern.

In particular, as illustrated in FIG. 20, a rectangular slit 424a relatively longer in the first direction than in the second direction is formed on the slit member 424. The slit member 424 allows the low-order first diffracted light DL1 to pass through the slit 424a, and blocks the high-order first diffracted light DL1 and the second diffracted light DL2. For that purpose, in this case, a size of the slit 424a is defined as follows.

That is, the size of the slit 424a in the first direction is larger than the sum of a beam size (diameter of the spot SP1) S1 of the first diffracted light DL1 at the focal position on the rear side of the lens 422 and a branching interval S2 of the first diffracted light DL1 at the focal position on the rear side of the lens 422. In this case, the branching interval S2 is a distance between the centers of the ±one-order first diffracted light DL1 in the first direction at the focal position on the rear side of the lens 422. In addition, in this case, the size of the slit 424a in the first direction is smaller than an interval S3 of the ±two-order first diffracted light DL1 at the focal position on the rear side of the lens 422.

On the other hand, the size of the slit 424a in the second direction is larger than the beam size of the first diffracted light DL1 at the focal position on the rear side of the lens 422. In addition, the size of the slit 424a in the second direction is smaller than a maximum diffraction distance F of first-order light expressed by the following formula (1) where the focal length of the lens 422 is f, the wavelength of the laser light L is λ, and the pixel size of the reflective spatial light modulator 410 is $x_{SLM}$. Therefore, in this case, the zero-order light and the lone-order light of the first diffracted light DL1 pass through the slit 424a, and the high-order light of equal to or more than ±three-order of the first diffracted light DL1 and the second diffracted light DL2 do not pass through the slit 424a and is blocked.

[Formula 2]

$$F = 2f \times \tan\left(\sin^{-1}\left(\frac{\lambda}{2x_{SLM}}\right)\right) \quad (1)$$

Figure 21:
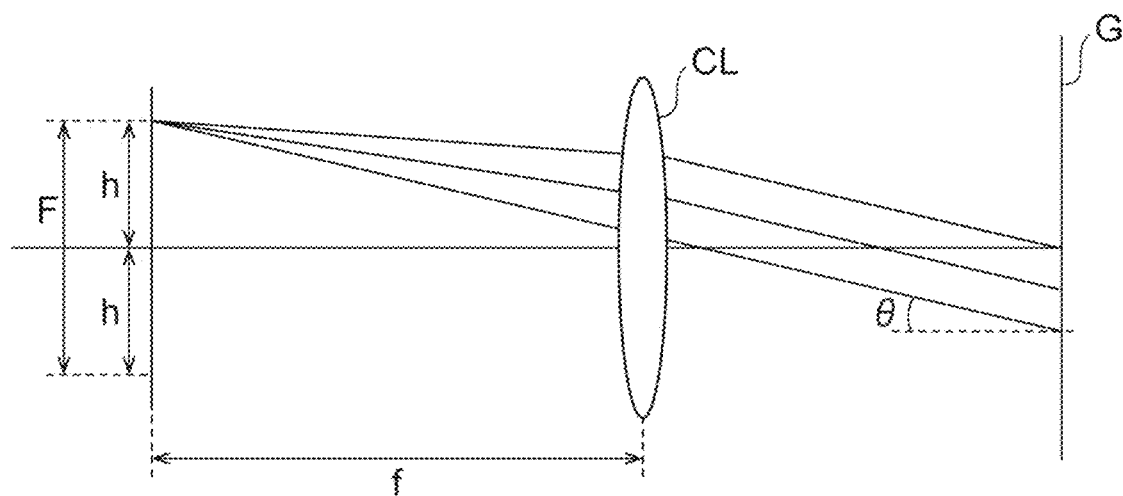
FIG. 21 is a diagram for explaining the maximum diffraction distance.

Here, the maximum diffraction distance F will be described. As illustrated in FIG. 21, when it is assumed that the diffraction angle in a diffraction grating G is θ, the diffraction order is m (m=0, ±1, ±2, ±3, ... ), and the grating interval (interval for one cycle) in the diffraction grating G is L, the relationship between the respective values is expressed by the following formula (2). The mth-order diffracted light indicates the light component diffracted by θ when the grating interval is L.

[Formula 3]

$$\sin\theta = \frac{m\lambda}{L} \quad (2)$$

Assuming that the light at the diffraction angle θ enters the focusing lens CL with the focal length f and an image height converged around the focal length f is h, the relationship between h and θ is expressed by the following formula (3).

[Formula 4]

$$h = f \times \tan\theta \quad (3)$$

Since the maximum diffraction angle (branching interval) in the spatial light modulator is when the grating interval L=2$X_{SLM}$, the maximum diffraction distance $F_m$=2×h (h is the absolute value) of m-order light is expressed by the following formula (4) in view of the formulae (2) and (3) mentioned above. Therefore, the maximum diffraction distance F of the first-order light in which m=1 is expressed by the formula (1) mentioned above.

[Formula 5]

$$Fm = 2f \times \tan\left(\sin^{-1}\left(\frac{m\lambda}{2x_{SLM}}\right)\right) \quad (4)$$

Note that the slit member 424 may be arranged near the focal position on the rear side of the lens 422. The area near the focal position is a range in the vicinity of the focal position, around the focal position, or a periphery of the focal position, in which the slit member 424 can shield the spatial frequency component of a certain value or more in the laser light L (range in which the diffracted light higher than a certain order can be blocked).

In addition, the beam size S1 of the first diffracted light DL1 at the focal position on the rear side of the lens 422 can change according to the phase pattern P0. That is, as described above, when the phase pattern P0 (for example, the first pattern P1) includes a pattern other than the diffraction lattice pattern, the beam size S1 may change. For example, the phase pattern P0 may include the aberration correction pattern for correcting aberration generated when the laser light L is converged onto the object to be processed 1. In this case, as compared with the case where the phase pattern P0 does not include the aberration correction pattern, the spread of the laser light L at the focal position on the rear side of the lens 422 becomes large. Accordingly, the beam size S1 increases. It is therefore sufficient to define the size of the slit 424a on the basis of the beam size S1 corresponding to the phase pattern P0.

Descriptions will be continued with reference to FIG. 16. The camera controller 504 controls the operation of the profile acquisition camera 464. In addition, the camera controller 504 obtains an intensity distribution image from the profile acquisition camera 464 to recognize it. Thus, the camera controller 504 can obtain the intensity of the laser light L. The storage 510 stores a phase pattern to be displayed on the reflective spatial light modulator 410, for example. In addition, the storage 510 may store the intensity of the laser light L obtained by the camera controller 504. Furthermore, a monitor 600 is connected to the controller 500. The monitor 600 can display the phase pattern to be displayed on the reflective spatial light modulator 410 (liquid crystal layer 216) by the spatial light modulator controller 502, and the intensity distribution image or the like obtained by the profile acquisition camera 464.

As described above, in the laser processing device 200, the laser light L output from the laser output unit 300 (laser oscillator 310) is modulated by the phase pattern P0 of the reflective spatial light modulator 410, and then converged by the converging lens unit 430 toward the object to be processed 1. The laser light L is emitted onto the object to be processed 1 along the first direction. In this case, the first direction is a direction in which the laser light L and the object to be processed 1 are relatively moved. The phase pattern P0 of the reflective spatial light modulator 410 has the first pattern P1 that modulates a part of the laser light L (effective light) entering the entrance pupil plane 430a of the converging lens unit 430, and the second pattern P2 that modulates the remainder of the laser light L (non-effective light). The first pattern P1 includes the first diffraction lattice pattern G1 for diffracting light along the first direction. Therefore, the effective light in the laser light L is branched into a plurality of first diffracted light DL1 in the first direction that is the irradiation direction (scanning direction) of the laser light L with respect to the object to be processed 1.

On the other hand, the second pattern P2 includes the second diffraction lattice pattern G2 for diffracting light along the second direction intersecting the first direction. Therefore, the non-effective light in the laser light L is branched into a plurality of second diffracted light DL2 in the second direction intersecting the scanning direction of the laser light L. Then, the second diffracted light DL2 is blocked by the slit 424a of the slit member 424 at the focal position on the rear side of the lens 422.

As a result, while the plurality of the first diffracted light DL1 that is the diffracted light of the effective light passes through the slit 424a and is emitted onto the object to be processed 1, the second diffracted light DL2 that is the diffracted light of the non-effective light is blocked by the slit 424a and does not reach the converging lens unit 430. Therefore, according to the laser processing device 200, it is possible to irradiate the object to be processed 1 with the laser light L by branching the laser light L into a plurality of parts while the change in the irradiation state of the laser light L with respect to the object to be processed 1 is suppressed. That is, it is possible to perform laser processing (formation of a modified region) at multiple points (three points in one example) along the lines to cut 5a and 5b while degradation of processing accuracy is suppressed.

In addition, in the laser processing device 200, the first diffraction lattice pattern G1 includes a plurality of groove patterns along the second direction, and the second diffraction lattice pattern G2 includes a plurality of groove patterns along the first direction. In this manner, the directions of the groove patterns of the first diffraction lattice pattern G1 and the second diffraction lattice pattern G2 are set to be crossed (orthogonal), whereby the branching direction of the first diffracted light DL1 and the branching direction of the second diffracted light DL2 can be set different from each other.

In addition, in the laser processing device 200, the size of the slit 424a in the first direction is larger than the sum of the beam size S1 of the first diffracted light DL1 at the focal position of the lens 422 and the branching interval S2 of the first diffracted light DL1 at the focal position, and the size of the slit 424a in the second direction is larger than the beam size S1 of the first diffracted light DL1 at the focal position. Therefore, the plurality of first diffracted light DL1 can be reliably emitted onto the object to be processed 1 without being blocked by the slit 424a.

In addition, in the laser processing device 200, the branching interval S2 may be an interval of ±one-order first diffracted light in the first direction. In this case, at least the zero-order light and the ±one-order light of the first diffracted light can be emitted onto the object.

In addition, in the laser processing device 200, the size of the slit 424a in the second direction is smaller than the maximum diffraction distance F expressed by the formula 1 mentioned above where the focal length of the lens 422 is f, the wavelength of the laser light L is λ, and the pixel size of the reflective spatial light modulator 410 is $x_{SLM}$. Therefore, the second diffracted light DL2 can be reliably blocked by the slit 424a.

Furthermore, in the laser processing device 200, the size of the slit 424a in the first direction is smaller than the interval S3 of the ±three-order first diffracted light DL1 at the focal position of the lens 422. Therefore, the high-order light of the first diffracted light equal to or higher than ±three-order can be blocked by the slit 424a.

The above is one embodiment according to one aspect of the present invention. One aspect of the present invention is not limited to the above-described embodiment, but may be modified within a range not changing the gist of each claim, or may be applied to another.

For example, the above-described embodiment is not limited to one configured to form the modified region 7 within the object to be processed 1, and may be one configured to perform another laser processing such as ablation. The above-described embodiment is not limited to a laser processing device used for laser processing of converging the laser light L within the object to be processed 1, and may be a laser processing device used for laser processing of converging the laser light L at the front surface 1a, 3, or the back surface 1b of the object to be processed 1. The device to which one aspect of the present invention is applied is not limited to the laser processing device, and may be applied to various laser light irradiating devices as long as an object is irradiated with the laser light L. Although the line to cut 5 is set to be the irradiation schedule line in the above-described embodiment, the irradiation schedule line is not limited to the line to cut 5, but may be any line as long as the emitted laser light L is aligned.

In the above embodiment, the imaging optical system constituting the double telecentric optical system in which the reflective surface 410a of the reflective spatial light modulator 410 and the entrance pupil plane 430a of the converging lens unit 430 are in the imaging relationship is not limited to the pair of lenses 422 and 423, and may be one including the first lens system (for example, a doublet, three or more lenses, or the like) on the reflective spatial light modulator 410 side, and the second lens system (for example, a doublet, three or more lenses, or the like) on the converging lens unit 430 side, or the like.

In addition, in the above-described embodiment, the profile acquisition camera 464 only needs to locate the imaging surface 464a thereof on a plane conjugate with the reflective surface of the liquid crystal layer 216 of the reflective spatial light modulator 410, and the profile acquisition camera 464 may be arranged at the position of the conjugate plane 491. In this case, the lens 463 is unnecessary in the laser processing device 200 (see FIG. 16). In the above-described embodiment, the relay magnification of the lens 422, lens 423, and lens 463 may be an arbitrary magnification. Although the reflective spatial light modulator 410 is included in the above-described embodiment, the spatial light modulator is not limited to the reflective type, and may be a spatial light modulator of a transmission type.

The converging lens unit 430 and the pair of distance measuring sensors 450 are attached to the end 401d of the housing 401 in the Y-axis direction; however, the converging lens unit 430 and the pair of distance measuring sensors 450 only need to be attached at a side closer to the end 401d from the center position of the housing 401 in the Y-axis direction. The reflective spatial light modulator 410 is attached to the end 401c of the housing 401 in the Y-axis direction; however, the reflective spatial light modulator 410 only needs to be attached at a side closer to the end 401c from the center position of the housing 401 in the Y-axis direction. In addition, the distance measuring sensors 450 may be arranged only on one side of the converging lens unit 430 in the X-axis direction.

Furthermore, the shape and size of the slit 424a are not limited to the example described above. For example, the slit 424a may have a relatively longer shape in the first direction than in the second direction, and may be, for example, an elliptical shape. The slit 424a does not necessarily block the high-order first diffracted light DL1. For example, the size of the slit 424a in the first direction may be larger than the interval of the ±two-order first diffracted light DL1.

In the above-described embodiment, the exemplary case where the first pattern P1 includes the first diffraction lattice pattern (another diffraction lattice pattern) has been described. However, the first pattern P1 may not include the diffraction lattice pattern. For example, the first pattern P1 may be a pattern for correcting aberration. On the other hand, the first pattern P1 and/or the second pattern P2 may include a pattern not only for branching the laser light L within a plane (for example, the X-Y plane) but also for branching the laser light L in the direction crossing the plane (for example, the Z direction: the depth direction).

Here, from the viewpoint of suppressing the change in the irradiation state of the laser light L onto the object to be processed 1, the liquid crystal layer 216 may include the effective region AC at which a part of the laser light L (effective light) is incident on the pupil plane of the converging lens unit (objective lens) 430, and the non-effective region at which the remainder (non-effective light) of the laser light L is incident, and the slit member 424 may block the light modulated in the non-effective region AB with the slit 424a. In particular, the shape of the effective region AC is not limited to the above-described circular shape, and may be an annular shape, for example. Furthermore, the shape of the non-effective region AB is not limited to the above-described annular shape, and may be a shape complementary to the effective region AC.

That is, as an example, in a case where the effective region AC is in the annular shape, the non-effective region AB may have a shape including a circular portion inside the circular ring and a portion outside the circular ring. That is, in the liquid crystal layer 216, the effective region AC and the non-effective region AB may be mixed along at least one direction. Even in such a case, as described above, it is sufficient to block only the light modulated in the non-effective region AB with the slit 424a.

INDUSTRIAL APPLICABILITY

A laser light irradiating device that can suppress a change in irradiation state of laser light with respect to an object can be provided.

REFERENCE SIGNS LIST

1 object to be processed (object)
100, 200 laser processing device (laser light irradiating device)
310 laser oscillator (laser light source)
410 reflective spatial light modulator (spatial light modulator)
422 lens (focusing lens)
424 slit member
424a slit
430 converging lens unit (objective lens)
430a entrance pupil plane (pupil plane)
L laser light
DL1 first diffracted light
DL2 second diffracted light
P0 phase pattern
P1 first pattern
P2 second pattern
G1 first diffraction lattice pattern
G2 second diffraction lattice pattern.

The invention claimed is:

1. A laser light irradiating device configured to irradiate an object with laser light along a first direction, the laser light irradiating device comprising:
   a laser light source configured to output the laser light;
   a spatial light modulator configured to modulate the laser light output from the laser light source according to a phase pattern and emit the laser light;
   an objective lens configured to converge the laser light emitted from the spatial light modulator onto the object;
   a focusing lens arranged between the spatial light modulator and the objective lens in an optical path of the laser light and configured to focus the laser light; and
   a slit member arranged at a focal position on a rear side of the focusing lens in the optical path of the laser light and configured to block a part of the laser light, wherein
   the phase pattern includes a first pattern in which a part of the laser light entering a pupil plane of the objective lens is modulated and a second pattern in which a remainder of the laser light is modulated,
   the second pattern includes a diffraction lattice pattern for branching the remainder of the laser light into a plurality of diffracted light along a second direction crossing the first direction, and
   the slit member blocks the diffracted light with a slit.

2. The laser light irradiating device according to claim 1, wherein
   the slit is formed so as to be relatively longer in the first direction than in the second direction.

3. The laser light irradiating device according to claim 1, wherein
the first pattern includes another diffraction lattice pattern for branching the part of the laser light into a plurality of other diffracted light along the first direction.

4. The laser light irradiating device according to claim 3, wherein
a size of the slit in the first direction is larger than a sum of a beam size of the other diffracted light at the focal position and a branching interval of the other diffracted light at the focal position, and
a size of the slit in the second direction is larger than a beam size of the diffracted light at the focal position.

5. The laser light irradiating device according to claim 4, wherein
the branching interval is an interval of the other diffracted light of ±one-order in the first direction.

6. The laser light irradiating device according to claim 4, wherein
the size of the slit in the second direction is smaller than a maximum diffraction distance F expressed by the following formula (1) in which a focal length of the focusing lens is represented by f, a wavelength of the laser light is represented by $\lambda$, and a pixel size of the spatial light modulator is represented by $x_{SLM}$.

[Formula 1]

$$F = 2f \times \tan\left(\sin^{-1}\left(\frac{m\lambda}{2x_{SLM}}\right)\right) \quad (1)$$

7. The laser light irradiating device according to claim 4, wherein
the size of the slit in the first direction is smaller than an interval of the other diffracted light of ±three-order at the focal position.

8. The laser light irradiating device according to claim 3, wherein
the another diffraction lattice pattern includes a plurality of groove patterns along the second direction, and
the diffraction lattice pattern includes a plurality of groove patterns along the first direction.

9. The laser light irradiating device according to claim 1, wherein
the spatial light modulator includes a liquid crystal layer configured to display the phase pattern,
the liquid crystal layer includes a circular effective region in a region in which the laser light is incident and an annular non-effective region outside the effective region,
the first pattern is displayed in the effective region and modulates the part of the laser light, and
the second pattern is displayed in the non-effective region and modulates the remainder of the laser light.

10. A laser light irradiating device configured to irradiate an object with laser light along a first direction, the laser light irradiating device comprising:
a laser light source configured to output the laser light;
a spatial light modulator configured to modulate the laser light output from the laser light source according to a phase pattern and emit the laser light;
an objective lens configured to converge the laser light emitted from the spatial light modulator onto the object;
a focusing lens arranged between the spatial light modulator and the objective lens in an optical path of the laser light and configured to focus the laser light; and
a slit member arranged at a focal position on a rear side of the focusing lens in the optical path of the laser light and configured to block a part of the laser light, wherein
the spatial light modulator includes a liquid crystal layer configured to display the phase pattern,
the liquid crystal layer includes an effective region in which a part of the laser light entering a pupil plane of the objective lens is incident and a non-effective region in which remainder of the laser light is incident, and
the slit member blocks light modulated in the non-effective region with a slit.

* * * * *